United States Patent
Gao et al.

(10) Patent No.: US 9,377,683 B2
(45) Date of Patent: Jun. 28, 2016

(54) IMPRINT TEMPLATE WITH OPTICALLY-DETECTABLE ALIGNMENT MARKS AND METHOD FOR MAKING USING BLOCK COPOLYMERS

(71) Applicant: HGST Netherlands B.V., Amsterdam (NL)

(72) Inventors: He Gao, San Jose, CA (US); Lei Wan, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 580 days.

(21) Appl. No.: 13/849,113

(22) Filed: Mar. 22, 2013

(65) Prior Publication Data

US 2014/0287083 A1 Sep. 25, 2014

(51) Int. Cl.
  *B44C 1/22* (2006.01)
  *G03F 7/00* (2006.01)
  *H01L 21/308* (2006.01)

(52) U.S. Cl.
  CPC ............ *G03F 7/0035* (2013.01); *G03F 7/0002* (2013.01); *H01L 21/308* (2013.01)

(58) Field of Classification Search
  CPC ..... G03F 7/0002; C23F 1/02; B81C 1/00031; H01L 21/0337; H01L 21/033; H01L 21/3086; H01L 21/3088; H01L 21/31058; H01L 21/2813
  USPC .......................... 216/11, 22, 41, 49, 67, 83, 47
  See application file for complete search history.

(56) References Cited

U.S. PATENT DOCUMENTS

| | | |
|---|---|---|
| 5,772,905 A | 6/1998 | Chou |
| 7,070,405 B2 | 7/2006 | Sreenivasan et al. |
| 7,419,764 B2 | 9/2008 | Park |
| 7,780,431 B2 | 8/2010 | Yu |
| 7,815,424 B2 | 10/2010 | Nakamura |
| 7,837,907 B2 | 11/2010 | Nimmakayala et al. |
| 7,976,715 B2 | 7/2011 | Dobisz et al. |
| 8,003,236 B2 | 8/2011 | Albrecht et al. |
| 8,012,395 B2 | 9/2011 | Selinidis |
| 8,119,017 B2 | 2/2012 | Albrecht et al. |

(Continued)

OTHER PUBLICATIONS

Park et al., "Sub-10 nm nanofabrication via nanoimprint directed self-assembly of block copolymers", ACS Nanolithography, Nov. 22, 2011;5(11):8523-31.

(Continued)

*Primary Examiner* — Lan Vinh
(74) *Attorney, Agent, or Firm* — Thomas R. Berthold

(57) ABSTRACT

A method using directed self-assembly of block copolymers (BCPs) for making an imprint template has the required patterns for both the features in the template's active area and the optically-detectable alignment marks in the template's non-active area. A chemical contrast pattern defined by a lithographic technique forms patterns of lines in both the active area and non-active area, as well as patterns of featureless gap regions in the non-active area. The pattern of lines has the BCP components aligned as lamellae perpendicular to the substrate, while the pattern of featureless gap regions has the BCP components aligned as lamellae parallel to the substrate. The patterns of lines and featureless gap regions in the non-active area define the optically detectable alignment marks. One of the BCP components is removed, leaving the other BCP component as an etch mask to fabricate the imprint template.

15 Claims, 19 Drawing Sheets

(56) References Cited

U.S. PATENT DOCUMENTS

| | | | |
|---|---|---|---|
| 8,257,598 B2 | 9/2012 | Albrecht et al. | |
| 8,308,471 B2 | 11/2012 | Seki | |
| 9,142,420 B2* | 9/2015 | Millward | B81C 1/00031 |
| 2005/0064344 A1 | 3/2005 | Bailey | |
| 2008/0180646 A1 | 7/2008 | Colburn | |
| 2011/0266706 A1* | 11/2011 | Dijksman | G03F 7/0002 264/40.1 |
| 2012/0107583 A1 | 5/2012 | Xiao et al. | |
| 2013/0105437 A1* | 5/2013 | Albrecht | B82Y 10/00 216/22 |
| 2013/0126473 A1* | 5/2013 | Dobisz | B82Y 30/00 216/49 |

OTHER PUBLICATIONS

Wan et al., "Fabrication of templates with rectangular bits on circular tracks by combining block copolymer directed self-assembly and nanoimprint lithography", J. Micro/Nanolith. MEMS MOEMS 11(3), 031405 (Jul.-Sep. 2012).

* cited by examiner

IMPRINT TEMPLATE WITH OPTICALLY-DETECTABLE ALIGNMENT MARKS AND METHOD FOR MAKING USING BLOCK COPOLYMERS

BACKGROUND OF THE INVENTION

1. Field of the Invention

This invention relates generally to an imprint template with optically detectable alignment marks, such as a template for imprinting patterned-media magnetic recording disks and semiconductor devices, and to a method for making it using directed self-assembly of block copolymers.

2. Description of the Related Art

Magnetic recording hard disk drives with patterned magnetic recording media have been proposed to increase data density. In patterned media, the magnetic recording layer on the disk is patterned into small isolated data islands arranged in concentric generally circular data tracks. To produce the required magnetic isolation of the patterned data islands, the magnetic moment of spaces between the islands must be destroyed or substantially reduced to render these spaces essentially nonmagnetic. In one type of patterned media, the data islands are elevated regions or pillars that extend above "trenches" and magnetic material covers both the pillars and the trenches, with the magnetic material in the trenches being rendered nonmagnetic, typically by "poisoning" with a material like silicon (Si). In another type of patterned media, the magnetic material is deposited first on a flat disk substrate. The magnetic data islands are then formed by milling, etching or ion-bombarding of the area surrounding the data islands. Patterned-media disks may be longitudinal magnetic recording disks, wherein the magnetization directions are parallel to or in the plane of the recording layer, or perpendicular magnetic recording disks, wherein the magnetization directions are perpendicular to or out-of-the-plane of the recording layer.

One proposed method for fabricating patterned-media disks is by imprinting with a template, sometimes also called a "stamper", that has a topographic surface pattern. In this method the magnetic recording disk substrate with a polymer film on its surface is pressed against the template. The patterns on the template may be protrusions (pillars), or recesses (holes), and the type of the pattern is referred to as the polarity of the template. The polymer film receives the reverse image of the template pattern and then, depending on the polarity of the template, either becomes a mask for subsequent etching of the disk substrate if the template is hole-type, or becomes a sacrificial layer for a tone reversal process such as liftoff followed by etching of the disk substrate, if the template is pillar type, to form pillars on the disk in both cases. In one type of patterned media, the magnetic layer and other layers needed for the magnetic recording disk are then deposited onto the etched disk substrate and the tops of the pillars to form the patterned-media disk. In another type of patterned media, the magnetic layers and other layers needed for the magnetic recording disk are first deposited on the flat disk substrate. The polymer film used with imprinting is then pressed on top of these layers. The polymer film receives the reverse image of the template pattern and then becomes a mask, or sacrificial layer for tone reversal, for subsequent milling, etching or ion-bombarding the underlying layers.

The template may be a master template for directly imprinting the disks. However, the more likely approach is to fabricate a master template with a pattern of pillars corresponding to the pattern of pillars desired for the disks and to use this master template to fabricate replica templates using imprint lithography. The replica templates may have the opposite or same polarity of the master template. The replica templates are then used to directly imprint the disks.

The making of a master imprint template is a difficult and challenging process. The use of electron beam (e-beam) lithography using a Gaussian beam rotary-stage e-beam writer is viewed as a possible method to make a master template capable of imprinting patterned-media disks with a track pitch (island-to-island spacing in the radial or cross-track direction) of about 35 nm, and an island pitch (island-to-island spacing in the circumferential or along-the-track direction) of about 35 nm. These dimensions generally limit the areal bit density of patterned-media disks to about 500 $Gbit/in^2$. To achieve patterned-media disks with an ultra-high areal bit density greater than 1 $Terabits/in^2$, a track pitch and an island pitch of about 20 nm will be required. However, a template capable of imprinting patterned-media disks with these small dimensions over an area equal to the active area of a disk may not be practical with the resolution of e-beam lithography.

Directed self-assembly of block copolymers (BCPs) has been proposed for making the template and is believed capable of achieving areal bit densities of greater than 1 $Terabit/in^2$. U.S. Pat. No. 7,976,715 B2, assigned to the same assignee as this application, describes the use of directed or guided self-assembly of block copolymers to form a pattern of generally radial lines on a template substrate, followed by conventional lithography to form a pattern of concentric generally circular rings over the radial lines. After etching of the substrate and removal of resist, the substrate has a pattern of protrusions of the other block copolymer component, which are then used as an etch mask to etch the substrate into a pattern for imprinting disks with discrete data islands arranged in concentric generally circular data tracks.

Another method to generate a master template containing a pattern of pillars corresponding to the pattern of data islands is to combine the patterns from two submaster templates using separate imprint steps. Each imprint submaster template is created using directed self-assembly of BCPs, and may also require line-doubling techniques for even smaller pattern size and higher density. Pending application Ser. No. 13/627,492, filed Sep. 26, 2012 and assigned to the same assignee as this application, describes the use of two such imprint submaster templates, one with a pattern of generally radial spokes or lines, and the other with generally concentric rings, to make the master template by two separate imprinting steps with the two submaster templates.

Proper alignment during an imprint step between the imprint template and substrate is often necessary. In the case of imprinting from a template to a disk, it is necessary to ensure that the imprinted pattern from the imprint template is concentric with the disk substrate because the eccentricity between the data pattern and the disk substrate on a finished media increases the repeatable runout (RRO), a factor which can cause the head to go off-track during the operation of the disk drive. In the case of using two submaster templates to create one master template, it is necessary for each submaster template to be aligned with the substrate of the master template during the two separate imprint steps to ensure the complete overlap of the patterns of rings and radial spokes, and formation of islands and servo patterns at the proper locations in all tracks.

Imprint templates have also been proposed for use in semiconductor manufacturing. For example, imprint templates can be used to pattern parallel generally straight lines in MPU, DRAM and NAND flash devices. Imprinting has been proposed and placed on the roadmap for making these devices below the node of 16 nm feature size. The semiconductor devices are typically silicon wafer based, and are manufactured in a sequence of steps, each stage placing a pattern of material on the wafer. In this way transistors, contacts, etc., all made of different materials, are laid down. In order for the final devices to function correctly, these separate patterns must be aligned correctly. For example, contacts, lines and transistors must all line up. Misalignment of any kind can cause short circuits and connection failures, which in turn impact fabrication yield and profit margins. The control of such pattern-to-pattern alignment is also referred to as "overlay control".

For these reasons, imprint templates are often required to have optically-detectable alignment marks located in the non-active areas outside the active area of the template, i.e., the area of the template containing the protrusions or recesses that corresponds to the area on an imprinted substrate containing structures serving functional purposes, such as data islands or servo features on a disk. The alignment marks typically serve no functional purposes on finished devices. When alignment is necessary, the substrate also needs to have corresponding alignment marks or a specific geometry (such as the center hole in a disk). The alignment marks on a template or substrate may be optically detectable. Optical detection is a known method, and can be done using scatterometry (such as sensing the diffracted or reflected light signal from grating-based alignment marks or certain geometry), or through image recognition (such as directly reading caliper or protractor shaped alignment marks, or detecting Morié patterns resulting from two overlapped grids with different pitch or orientation). In one approach to align the template and substrate during imprinting, the imprint system optically detects the alignment marks on the template, and alignment marks or certain geometry on the substrate to determine their coordinates (locations), applies the imprint resist to the substrate, then brings the template and substrate to a common coordinate for contact and presses them together to complete the imprinting. In a more sophisticated approach, the imprint system first applies the resist to the substrate, brings the template and substrate almost in contact, then determines the misalignment by analyzing optical signals from alignment marks on both the template and substrate and actively adjusts their relative positions to reduce the misalignment within a set specification, before finally pressing the template and substrate together to complete the imprinting.

On an imprint template fabricated using directed self-assembly of BCPs, the dimensions and pitches of the template features are determined by the natural pitch ($L_0$) of the BCPs, which are typically in the range of 8-60 nm. However, due to the optical diffraction limit, optically detectable alignment marks need to have dimensions and pitches in the order of the wavelength of the detection light source, or larger. To avoid premature exposure of the photosensitive imprint resist to a curing light, the light source typically has a wavelength between 500 nm to a few microns. Typical alignment marks have dimensions of at least a micron. Thus directed self-assembly of BCPs used to form high density patterns with pitches less than 60 nm in the active area is not capable of simultaneously forming alignment marks with dimensions and pitches in the micron range. If a separate step is used to form the alignment marks in addition to the directed self-assembly of BCPs, the alignment marks will lose their intrinsic self-alignment with the BCP patterns in the active area, resulting in a build-in misalignment at the template level which propagates to all imprinted substrates.

What is needed is a imprint template and a method for making it using self-assembly of BCPs that can result in the simultaneous formation of the desired high density patterns in the active area and the required alignment marks in the non-active area.

SUMMARY OF THE INVENTION

The invention relates to a method using directed self-assembly of BCPs for making an imprint template that has the required patterns for both high density features in the active area and the optically-detectable alignment marks in the non-active area. The template is used in the imprinting process to make patterned-media disks, semiconductor devices, or another imprint template.

The method uses directed self-assembly of a BCP by a chemical contrast pattern defined by a lithographic technique to form patterns of generally radial lines and/or concentric generally circular rings and/or generally parallel lines in both the active area and non-active area, as well as patterns of featureless gap regions in the non-active area. The pattern of lines and/or rings have the BCP components aligned as lamellae perpendicular to the substrate, while the pattern of featureless gap regions has the BCP components aligned as lamellae parallel to the substrate. The featureless gap regions along with arrays of lines and/or rings in the non-active area define the optically detectable alignment marks in a laminated manner. One of the BCP components is removed, leaving the other BCP component as an etch mask to fabricate either the final master template or two separate submaster templates that are then used to fabricate the master template.

For a fuller understanding of the nature and advantages of the present invention, reference should be made to the following detailed description taken together with the accompanying figures.

BRIEF DESCRIPTION OF THE DRAWING

FIGS. 7A-7O are views illustrating a second method for making the template of this invention with optically-detectable alignment marks in the non-active area, wherein

DETAILED DESCRIPTION OF THE INVENTION

Figure 1:
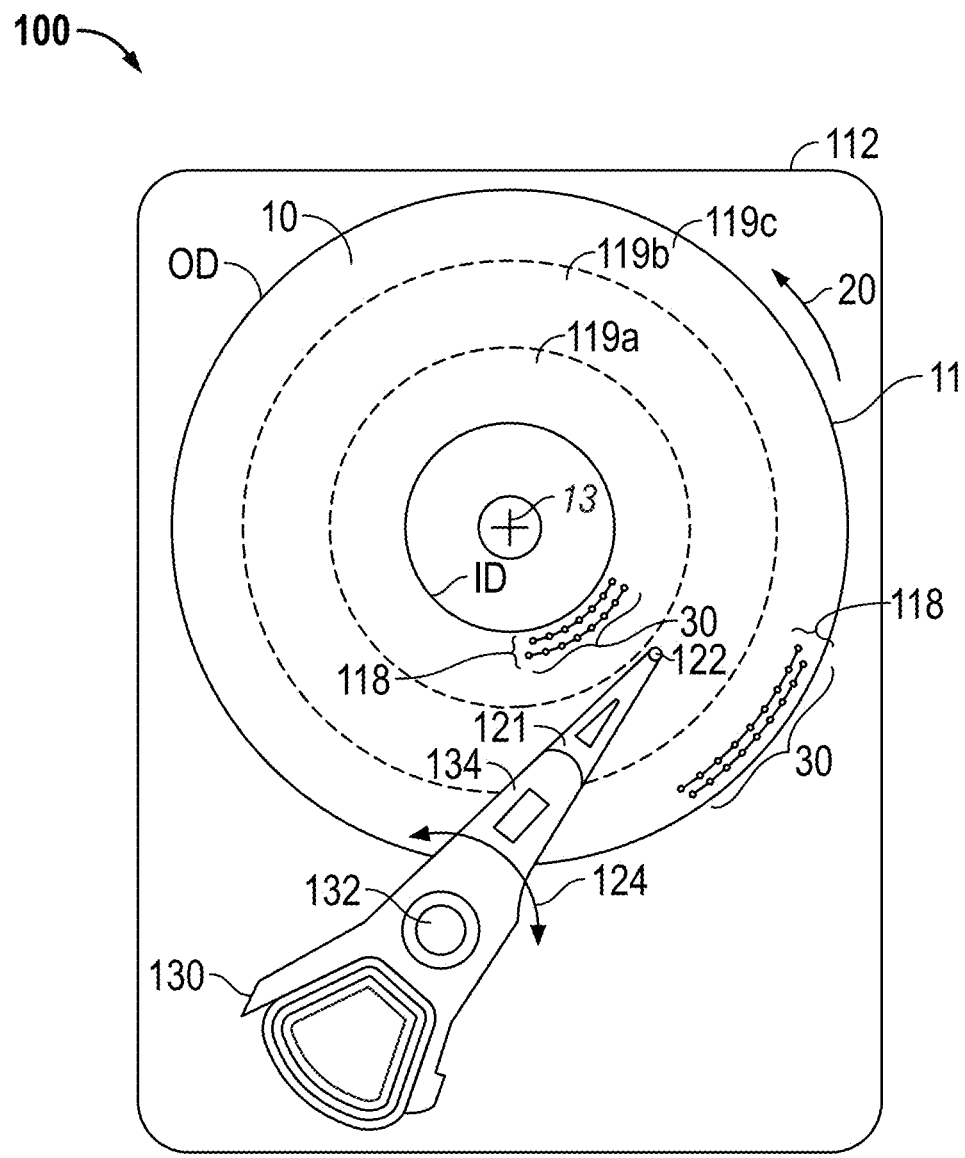
FIG. 1 is a top view of a disk drive with a patterned-media type of magnetic recording disk as described in the prior art.

FIG. 1 is a top view of a disk drive 100 with a patterned magnetic recording disk 10 as described in the prior art. The drive 100 has a housing or base 112 that supports an actuator 130 and a drive motor for rotating the magnetic recording disk 10 about its center 13. The actuator 130 may be a voice coil motor (VCM) rotary actuator that has a rigid arm 134 and rotates about pivot 132 as shown by arrow 124. A head-suspension assembly includes a suspension 121 that has one end attached to the end of actuator arm 134 and a head carrier 122, such as an air-bearing slider, attached to the other end of suspension 121. The suspension 121 permits the head carrier 122 to be maintained very close to the surface of disk 10. A magnetoresistive read head (not shown) and an inductive write head (not shown) are typically formed as an integrated read/write head patterned on the trailing surface of the head carrier 122, as is well known in the art.

The patterned magnetic recording disk 10 includes a disk substrate 11 and discrete data islands 30 of magnetizable material on the substrate 11. The data islands 30 function as discrete magnetic bits for the storage of data and are arranged in radially-spaced circular tracks 118, with the tracks 118 being grouped into annular zones 119a, 119b, 119c. The grouping of the data tracks into annular zones permits zoned recording, wherein the angular spacing of the data islands, and thus the data rate, is different in each zone. In FIG. 1, only a few islands 30 and representative tracks 118 are shown in the inner zone 119a and the outer zone 119c. As the disk 10 rotates about its center 13 in the direction of arrow 20, the movement of actuator 130 allows the read/write head on the trailing end of head carrier 122 to access different data tracks 118 on disk 10. Rotation of the actuator 130 about pivot 132 to cause the read/write head on the trailing end of head carrier 122 to move from near the disk inside diameter (ID) to near the disk outside diameter (OD) will result in the read/write head making an arcuate path across the disk 10.

Figure 2:
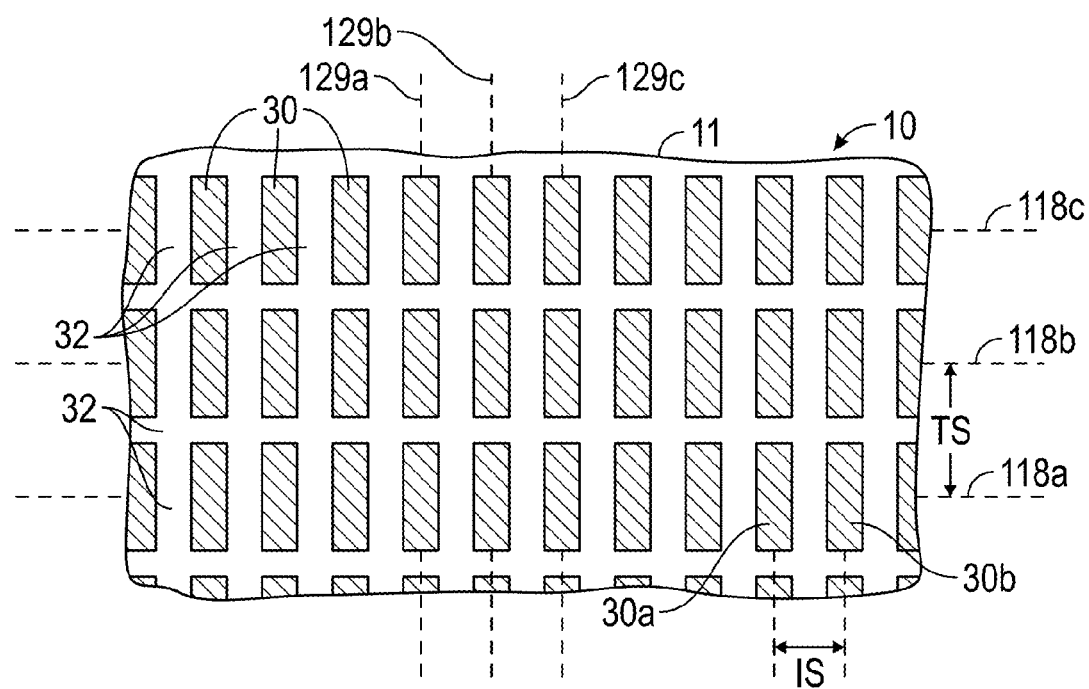
FIG. 2 is a top view of an enlarged portion of a patterned-media type of magnetic recording disk showing the detailed arrangement of the data islands in one of the zones on the surface of the disk substrate.

FIG. 2 is a top view of an enlarged portion of disk 10 showing the detailed arrangement of the data islands 30 separated by nonmagnetic regions 32 in one of the zones on the surface of disk substrate 11 according to the prior art. The islands 30 are shown as being generally rectangularly shaped. The islands 30 contain magnetizable recording material and are arranged in tracks spaced-apart in the radial or cross-track direction, as shown by tracks 118a-118c. The tracks are typically spaced apart by a nearly fixed track pitch or spacing TS. Within each track 118a-118c, the islands 30 are roughly equally spaced apart by a nearly fixed along-the-track island pitch or spacing IS, as shown by typical islands 30a, 30b, where IS is the spacing between the centers of two adjacent islands in a track.

The bit-aspect-ratio (BAR) of the pattern of discrete data islands arranged in concentric generally circular tracks is the ratio of track spacing or pitch in the radial or cross-track direction to the island spacing or pitch in the circumferential or along-the-track direction. This is the same as the ratio of linear island density in bits per inch (BPI) in the along-the-track direction to the track density in tracks per inch (TPI) in the cross-track direction. In FIG. 2, TS is approximately twice IS, so the BAR is approximately 2.

The islands 30 are also arranged into generally radial lines, as shown by radial lines 129a, 129b and 129c that extend from disk center 13 (FIG. 1). Because FIG. 2 shows only a very small portion of the disk substrate 11 with only a few of the data islands, the pattern of islands 30 appears to be two sets of perpendicular lines. However, tracks 118a-118c are concentric generally circular rings centered about the center 13 of disk 10 and the lines 129a, 129b, 129c are not parallel lines, but radial lines extending from the center 13 of disk 10. Thus the angular spacing between adjacent islands as measured from the center 13 of the disk for adjacent islands in lines 129a and 129b in a radially inner track (like track 118c) is the same as the angular spacing for adjacent islands in lines 129a and 129b in a radially outer track (like track 118a).

The generally radial lines (like lines 129a, 129b, 129c) may be perfectly straight radial lines but are preferably arcs or arcuate-shaped radial lines that replicate the arcuate path of the read/write head on the rotary actuator. Such arcuate-shaped radial lines provide a constant phase position of the data islands as the head sweeps across the data tracks. There is a very small radial offset between the read head and the write head, so that the synchronization field used for writing on a track is actually read from a different track. If the islands between the two tracks are in phase, which is the case if the radial lines are arcuate-shaped, then writing is greatly simplified.

Patterned-media disks like that shown in FIG. 2 may be longitudinal magnetic recording disks, wherein the magnetization directions in the magnetizable recording material are parallel to or in the plane of the recording layer in the islands, but are more likely to be perpendicular magnetic recording disks, wherein the magnetization directions are perpendicular to or out-of-the-plane of the recording layer in the islands. To produce the required magnetic isolation of the patterned data islands 30, the magnetic moment of the regions between 32 the islands must be destroyed or substantially reduced to render these spaces essentially nonmagnetic. The term "nonmagnetic" means that the spaces between the islands are formed of a non-ferromagnetic material, such as a dielectric, or a material that has no substantial remanent moment in the absence of an applied magnetic field, or a magnetic material in a trench recessed far enough below the islands to not adversely affect reading or writing. The nonmagnetic spaces may also be the absence of magnetic material, such as trenches or recesses in the magnetic recording layer or disk substrate.

Figure 3A:
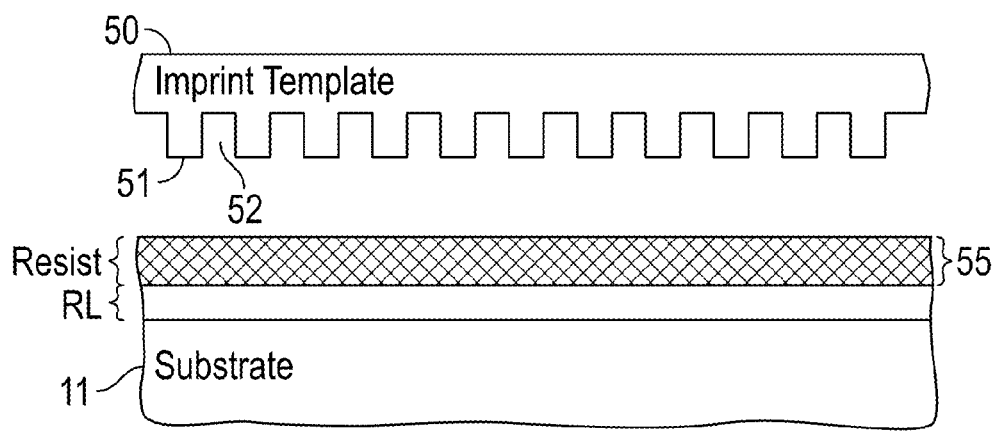
FIGS. 3A-3C are sectional views illustrating the general concept of imprinting according to the prior art.
Figure 3B:
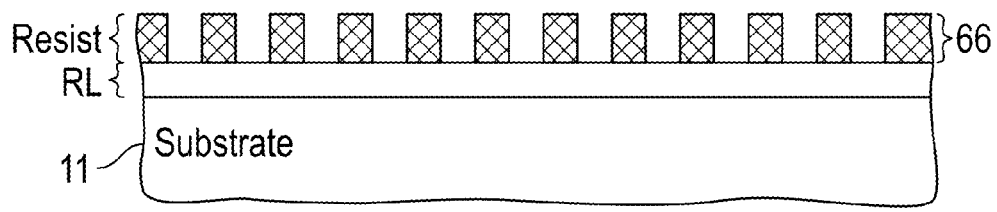
Figure 3C:
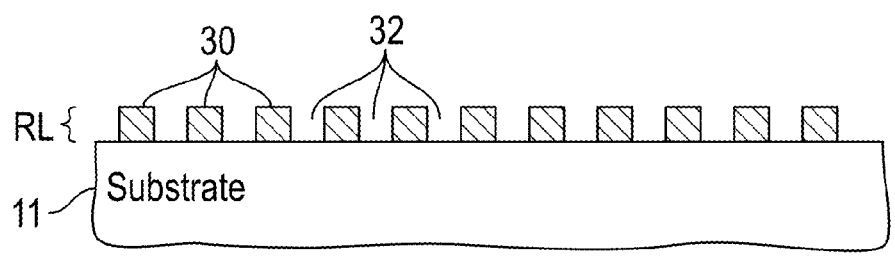

One proposed technique for fabricating patterned magnetic recording disks is by imprinting using a master template. FIGS. 3A-3C are sectional views illustrating the general concept of imprinting. FIG. 3A is a sectional view showing the disk according to the prior art before lithographic patterning and etching to form the data islands. The disk has a substrate 11 supporting a recording layer (RL) having perpendicular (i.e., generally perpendicular to substrate surface) magnetic anisotropy. A layer of imprint resist 55 is formed on the RL. The structure of FIG. 3A is then lithographically patterned by imprinting with a UV-transparent template 50 that has pillars 51 and recesses 52 that will form the desired pattern of data islands. The template 50 is typically a fused quartz substrate that has been etched away in different etching steps to form the desired pattern. The template 50 with its predefined pattern is brought into contact with the liquid imprint resist layer, which is a UV-curable polymer, and the template 50 and disk are pressed together. UV light is then transmitted through the transparent template 50 to cure the liquid imprint resist. After the resist has hardened, the template is removed, leaving the inverse pattern of the template on the hardened resist layer. The template is separated from the disk and the patterned imprint resist 66 is left. The resulting structure is shown in FIG. 3B. The patterned imprint resist 66 is then used as an etch mask. Reactive-ion-etching (RIE) can be used to transfer the pattern from the imprint resist to the underlying RL. The imprint resist is then removed, leaving the resulting structure of data islands 30 of RL material separated by nonmagnetic regions 32, as shown in FIG. 3C. As an alternative to the use of a single master template that contains the pattern of data islands shown in FIG. 2, the disk can be patterned in a two-step process by the use of two submaster templates. One submaster template contains a pattern of radial bars with a circumferential pitch corresponding to the along-the-track island pitch IS of the data islands, and the other submaster template contains a pattern of concentric generally circular rings with a radial pitch corresponding to the track pitch TS of the data islands (see FIG. 2). FIGS. 3A-3C are highly schematic representations merely to illustrate the general imprinting process. The disk would typically include additional layers below the RL. Also the structure of FIG. 3C would typically then be planarized with fill material in the nonmagnetic regions 32, followed by deposition of a protective overcoat and liquid lubricant.

The making of the master or submaster templates to achieve an ultrahigh density patterned-media disk is a difficult and challenging process. The use of electron beam (e-beam) lithography using a Gaussian beam rotary-stage e-beam writer is viewed as a possible method. However, a template capable of imprinting patterned-media disks with the small dimensions required to achieve areal bit densities of greater than 1 Terabit/in$^2$ may not be practical with the resolution of e-beam lithography.

Thus directed self-assembly of block copolymers (BCPs) has been proposed for making the templates and is believed capable of achieving areal bit densities of greater than 1 Terabit/in$^2$. U.S. Pat. No. 8,119,017 B2 and U.S. Pat. No. 7,976,715 B2, both assigned to the same assignee as this application, describe in detail the use of directed self-assembly of BCPs to form patterns on master or submaster templates. After removal of resist and one of the BCP components, the template substrate has a pattern of protrusions of the other BCP component, which are then used as an etch mask to etch the substrate. This results in either a master template with protrusions of substrate material corresponding to the desired pattern of data islands, or a submaster template with protrusions of substrate material corresponding to the desired pattern of radial bars or circumferential rings.

Another method to generate a master template containing pattern of pillars corresponding to the pattern of data islands is to combine the patterns from two submaster templates using separate imprint steps. Each imprint submaster template is created using directed self-assembly of BCPs, and may also require line-doubling techniques for even smaller pattern size and higher density. Pending application Ser. No. 13/627,492, filed Sep. 26, 2012 and assigned to the same assignee as this application, describes the use of two such imprint submaster templates, one with a pattern of generally radial spokes or lines, and the other with generally concentric rings, to make the master template by two separate imprinting steps with the two submaster templates.

Self-assembling BCPs typically contain two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of BCPs that can be used for forming the self-assembled periodic patterns. If one of the components A or B is selectively removable without having to remove the other, then an orderly arranged structural units of the un-removed component can be formed.

Specific examples of suitable BCPs that can be used for forming the self-assembled periodic patterns include, but are not limited to: poly(styrene-block-methyl methacrylate) (PS-b-PMMA), poly(ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), and poly(styrene-block-dymethylsiloxane) (PS-b-PDMS).

The specific self-assembled periodic patterns formed by the BCP are determined by the molecular volume ratio between the first and second polymeric block components A and B. When the ratio of the molecular volume of the second polymeric block component B over the molecular volume of the first polymeric block component A is less than about 80:20 but greater than about 60:40, the BCP will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the BCP will form alternating lamellae composed of the first and second polymeric block components A and B. The un-removed component is used as an etch mask to etch the underlying template substrate.

The periodicity or natural pitch ($L_0$) of the repeating structural units in the periodic pattern is determined by intrinsic polymeric properties such as the degree of polymerization N and the Flory-Huggins interaction parameter $\chi$. $L_0$ scales with the degree of polymerization N, which in turn correlates with the molecular weight M. Therefore, by adjusting the total molecular weight of the BCP of the present invention, the natural pitch ($L_0$) of the repeating structural units can be selected.

Figure 4A:
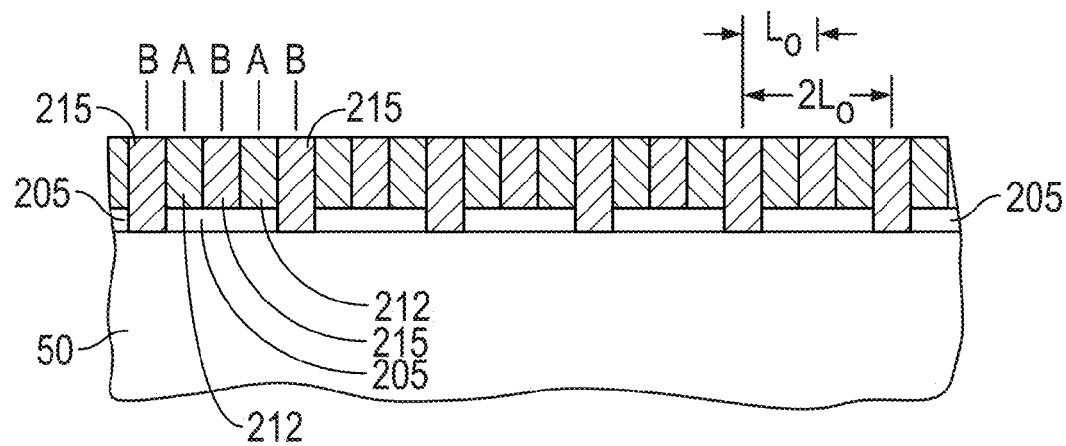
FIGS. 4A-4D are views illustrating the prior art method for making an imprint template using block copolymers (BCPs).
Figure 4B:
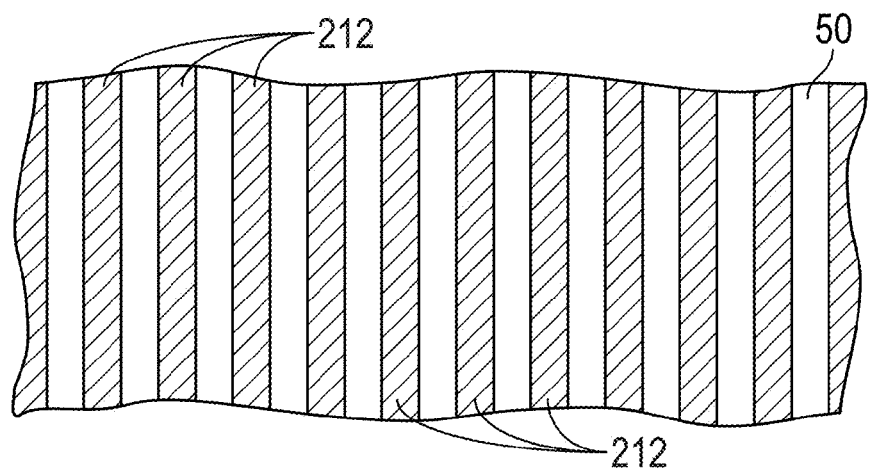
Figure 4C:
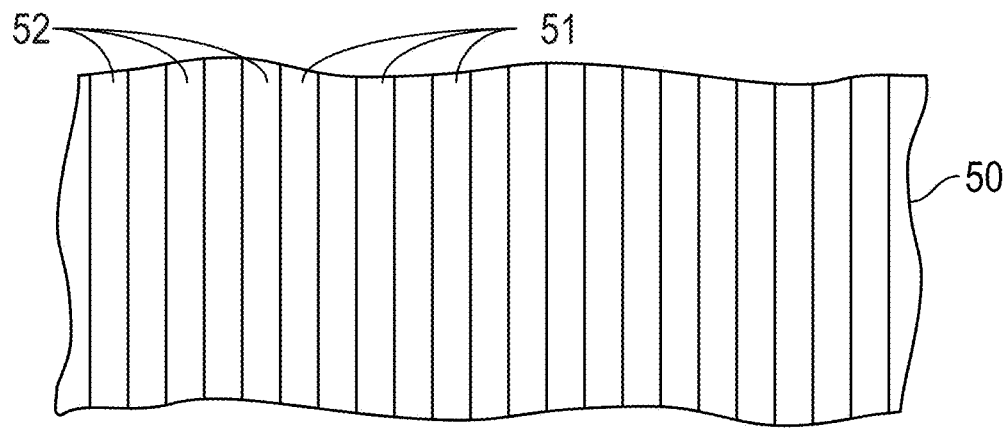
Figure 4D:
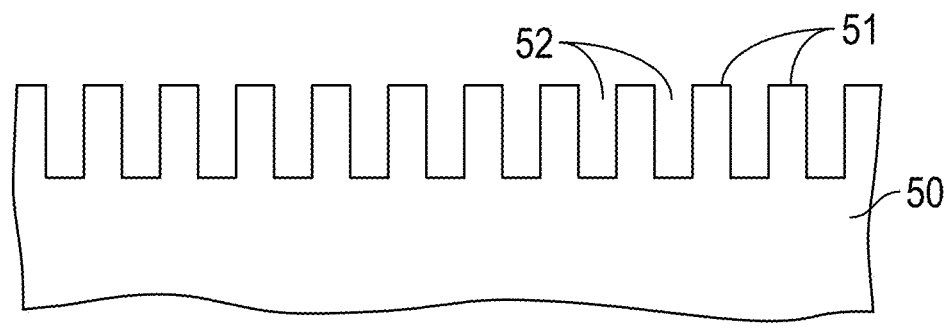

The prior art method for making a imprint template using BCPs will be described in general terms with FIGS. 4A-4D for an example where the template 50 will become a submaster template with protrusions 51 in a pattern of radial bars (FIG. 2). FIG. 4A is a side sectional view showing a patterned neutral layer 205 on the surface of template 50. Alternating A component (polystyrene—PS) radial lines 212 and B component (PMMA) radial lines 215 are formed on a sublayer 205 and regions of the template 50 not covered by sublayer 205. The sublayer 205 has been patterned to facilitate the self-assembly of the BCP A and B components. In FIG. 4B, the portions of radial lines 215, the B component (PMMA), are then selectively removed by a wet etch or a dry etch process. This leaves generally radial lines 212 of the A component (PS) on the template 50. Then, a dry etch process is used to etch the template 50 to form recesses 52 using the radial lines 212 as the etch mask. The material of radial lines 212 and the remaining underlying sublayer 205 is then removed, leaving recesses 52 in template 50. This leaves the structure as shown in FIG. 4C, with a pattern of protrusions formed as radial bars 51 and recesses formed as radial bars 52. FIG. 4D is a side sectional view of the resulting submaster template.

Imprint templates are often required to have optically-detectable alignment marks located in the non-active areas outside the active area of the template, i.e., the area of the template containing the protrusions or recesses that correspond to the area on an imprinted substrate containing structures serving functional purposes, such as data islands or servo features on a disk. The alignment marks are used by the imprint system to align the template with the substrate to be imprinted. On an imprint template fabricated using directed self-assembly of BCPs, the dimensions and pitches of the template features are determined by the natural pitch ($L_0$) of the BCPs, which are typically in the range of 8-60 nm. However, due to the optical diffraction limit, optically detectable alignment marks need to have dimensions and pitches in the order of the wavelength of the detection light source or larger. To avoid premature exposure of the photosensitive imprint resist to a curing light, the light source is typically has a wavelength between 500 nm to a few microns. Typical alignment marks have dimensions of at least a micron. Thus directed self-assembly of BCPs used to form high density patterns with pitches less than 60 nm in the active area is not capable of simultaneously forming alignment marks with dimensions and pitches in the micron range. If a separate step is used to form the alignment marks in addition to the directed self-assembly of BCPs, The alignment marks will lose their intrinsic self-alignment with the BCP patterns in the active area, resulting in a build-in misalignment at the template level which propagates to all imprinted substrates.

Figure 5A:
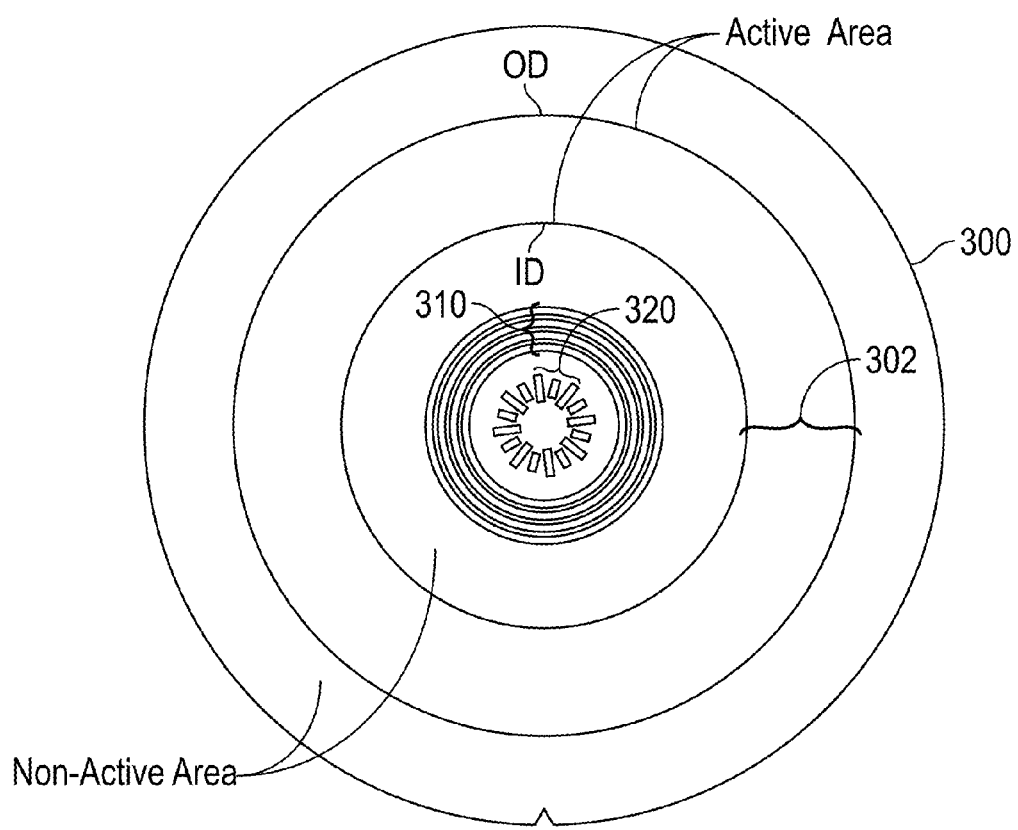
FIG. 5A is a plan view of a submaster template showing the active area, defined by an inside diameter (ID) and outside diameter (OD), and the non-active areas with alignment marks according to the invention.

This invention is a template and method of making it using BCPs to form optically-detectable alignment marks in the non-active area of the template simultaneous with the formation of protrusions and recesses in the active area of the template. Instead of directly forming the alignment marks with dimensions of at least one micron, the alignment marks in this invention are formed in a laminated manner to be compatible with the BCP process. FIG. 5A is a plan view of a submaster template 300 showing the active area, defined by an inside diameter (ID) and outside diameter (OD), and the non-active areas. The submaster template 300 is depicted as one having concentric generally circular rings 302 of protrusions and recesses, but it may also be a submaster template with a plurality of radial bars of protrusions and recesses, or alternatively a master template with a pattern of islands of protrusions and recesses corresponding to the data islands to be formed on the disks. Two types of exemplary alignment marks are located in the non-active area. Marks 310 are circular lines, and marks 320 are radial lines.

Figure 5B:
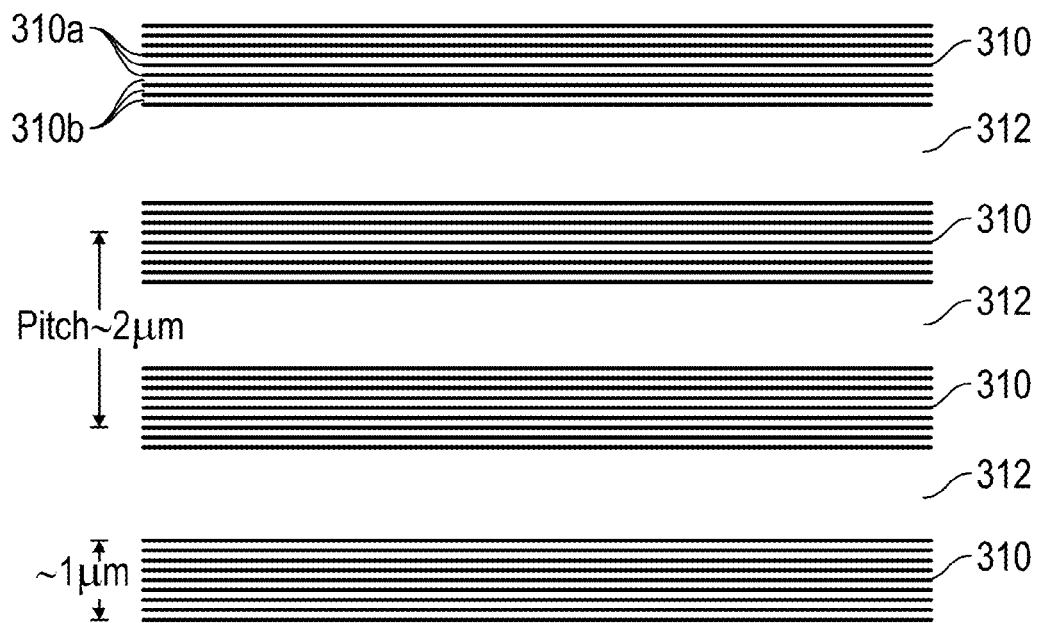
FIG. 5B is an enlarged view of a portion of the circular line marks of FIG. 5A wherein each mark is a plurality of concentric generally circular lines.
Figure 5C:
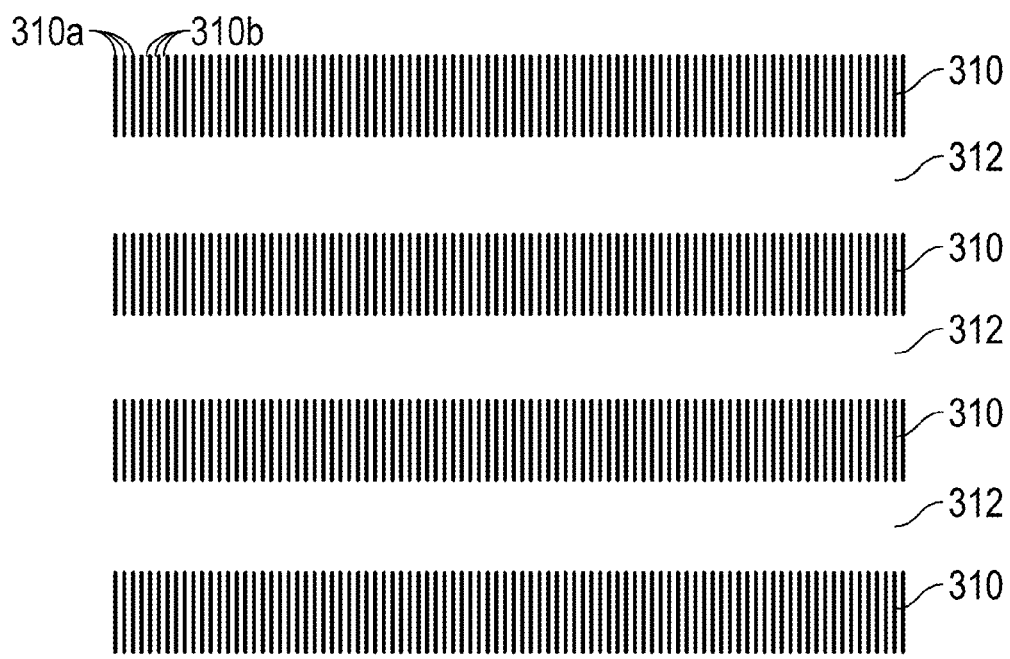
FIG. 5C is an enlarged view of a portion of the circular line marks of FIG. 5A wherein each mark is a plurality of generally radial lines.

FIG. 5B is an enlarged view of a portion of the circular line marks 310 of FIG. 5A. The marks 310 are depicted as an optical grating so they are spaced apart by gaps 312. The marks 310 have a width in the micron range, and are depicted with a 1 μm width and a radial pitch of 2 μm. The marks 310 are formed in template 300 using BCPs in the same manner and simultaneously with the formation of the concentric generally circular rings 302 in the active area. Thus, each mark 310 is a plurality of alternating protrusions 310a and recesses 310b with the same dimensions and radial pitch as the concentric generally circular rings 302 in the active area. As will be explained below, the lines of protrusions 310a in each mark 310 thus have a radial pitch of $L_0$, the same as that of the active area pattern, and $L_0$ is the natural pitch for the selected BCP. The lines of protrusions 310a and recesses 310b are the result of the BCP self-assembly guided by the e-beam patterned sublayer below the BCP using a rotary e-beam writer to write circular lines with a pitch of $nL_0$, where n is an integer. However, the marks 310 may alternatively be a plurality of alternating radial lines of protrusions 310a, 310b, as depicted in FIG. 5C. The radial lines 310a, 310b in FIG. 5C would result if the rotary e-beam writer wrote radial lines on the sublayer below the BCP. The marks 310 are the result of the BCP process wherein the A and B components become arranged as lamellae perpendicular to the template substrate, and the gaps 312 are the result of the BCP process wherein the A and B components become arranged as lamellae parallel to the template substrate.

Figure 5E:
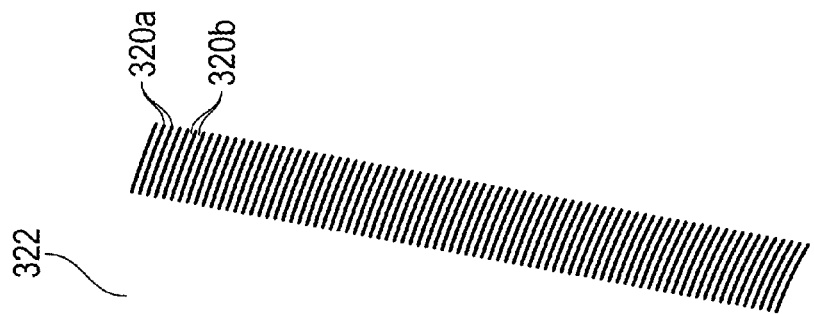
FIG. 5E is an enlarged view of a portion of the radial line marks of FIG. 5A wherein each mark is a plurality of concentric generally circular lines.
Figure 5E:
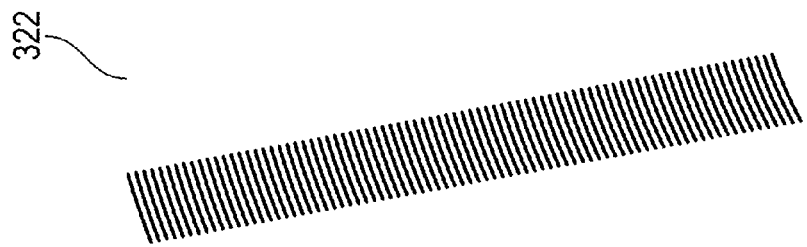
Figure 5D:
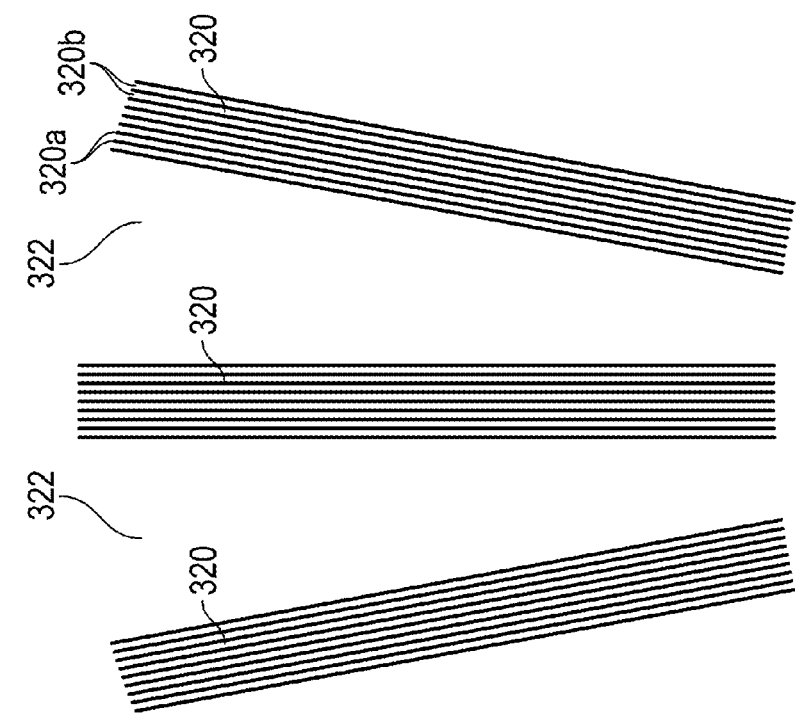
FIG. 5D is an enlarged view of a portion of the radial line marks of FIG. 5A wherein each mark is a plurality of radial lines.

FIGS. 5D and 5E are enlarged views of a portion of the radial line marks 320 of FIG. 5A. They are formed in the same manner as the marks 310 in FIGS. 5B and 5C. In FIG. 5D, the lines of protrusions 320a and recesses 320b in each alignment mark 320 are the result of e-beam patterning the sublayer below the BCP using a rotary e-beam writer to write radial lines. However, the marks 320 may alternatively be a plurality of alternating arcs of circular lines of protrusions 320a, 320b, as depicted in FIG. 5E. The circular arc lines 320a, 320b in FIG. 5E would result if the rotary e-beam writer wrote circular arcs on the sublayer below the BCP. The marks 320 are the result of the BCP process wherein the A and B components become arranged as lamellae perpendicular to the template substrate, and the gaps 322 are the result of the BCP process wherein the A and B components become arranged as lamellae parallel to the template substrate.

Figure 5F:
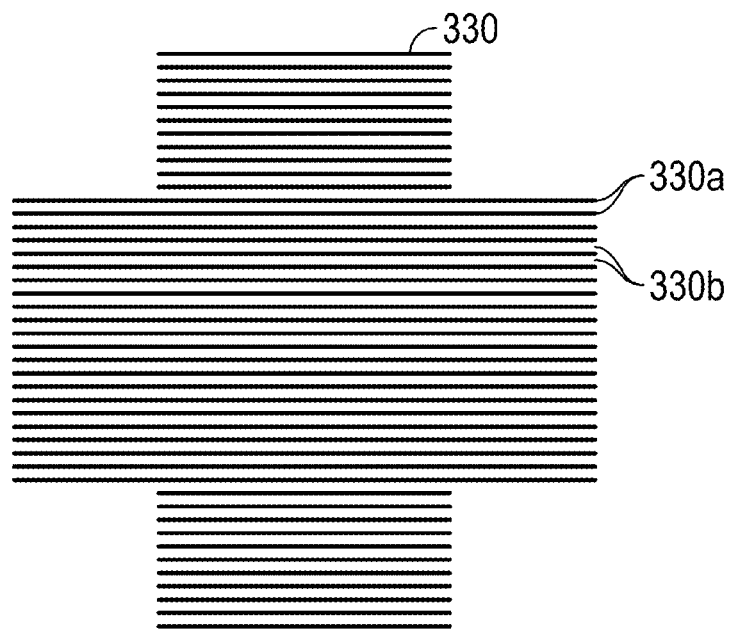
FIGS. 5F and 5G illustrate a crossbar alignment mark, with alternating horizontal lines of protrusions and recesses (FIG. 5F) and alternating vertical lines of protrusions and recesses (FIG. 5G).
Figure 5G:
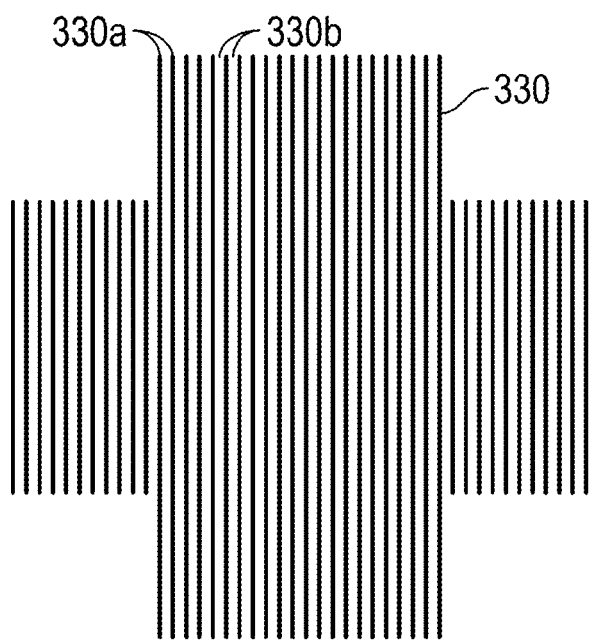

The alignment marks are not limited to circular and radial marks, but may have other shapes. FIGS. 5F and 5G illustrate a crossbar alignment mark 330, with alternating horizontal lines of protrusions 330a and recesses 330b (FIG. 5F) and alternating vertical lines of protrusions 330a and recesses 330b (FIG. 5G). These alignment marks would be the result of patterning the sublayer for the BCP with an x-y stage e-beam writer that writes horizontal and vertical lines.

A first method for making the template of this invention with optically-detectable alignment marks in the non-active area will be described with FIGS. 6A-6J. FIGS. 6A-6C, 6E-6G and 6J are side sectional views, at various stages of the fabrication method, and FIGS. 6D, 6H and 6J are top views at various stages of the method. The method will be described in FIGS. 6A-6J for making a submaster template with generally radial lines in the active area, and with radial alignment marks like marks 320 with radial lines of protrusions 320a and recesses 320b as shown in FIG. 5D. However, the method is identical for making a submaster template with generally concentric circular lines in the active area, and with various other shapes of alignment marks in the non-active area.

Figure 6A:
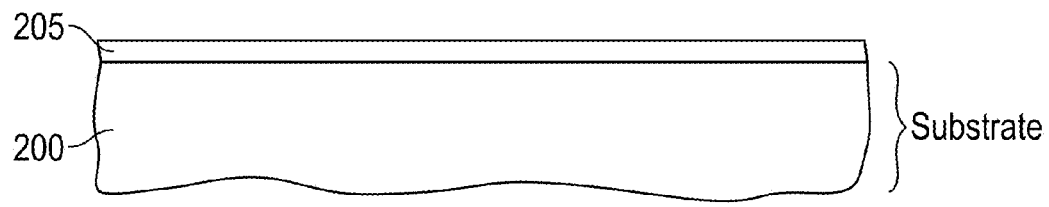
FIGS. 6A-6J are views illustrating a first method for making the template of this invention with optically-detectable alignment marks in the non-active area.

Referring first to FIG. 6A, the substrate 200 comprises a base 200, which may be formed of any suitable material, such as, but not limited to, single-crystal Si, amorphous Si, silica, fused quartz, silicon nitride, carbon, tantalum, molybdenum, chromium, alumina and sapphire. A sublayer 205 of a nearly neutral layer of a material that does not show a strong wetting affinity by one of the polymer blocks over the other, that will be referred to as "neutral layer", is deposited onto the substrate 200. The neutral layer can be, but is not restricted to, a functionalized polymer brush, a cross-linkable polymer, a functionalized polymer "A" or "B" or a functionalized random copolymer "A-r-B". The functional group may be, for example, a hydroxyl group. In the present example, the neutral layer 205 is a hydroxyl-terminated poly(styrene-r-methyl methacrylate) brush containing ~67% styrene. The brush material is spin-coated on substrate 200 to a thickness of about 1-10 nm (below 6 nm is preferred), followed by baking at about 250° C. and rinsing in a solvent to remove the extra brush material that is not chemically bonded to the substrate. The purpose of the neutral layer is to tune the surface energy adequately to promote the desired domain orientation (perpendicular lamellae) and to provide the adequate wetting conditions for density multiplication.

Figure 6B:
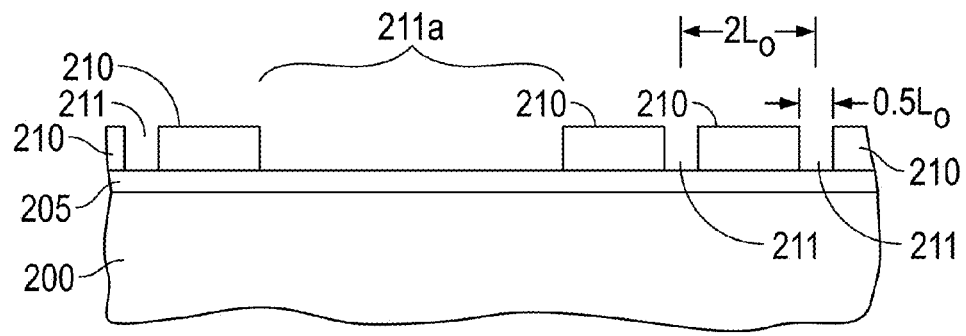

In FIG. 6B a resist layer has been deposited on neutral layer 205 and patterned into generally radial stripes 210 of resist. The resist may be a positive e-beam resist like poly methyl methacrylate (PMMA) or ZEP520 from Zeon Chemicals, L.P. The resist layer is patterned by e-beam and developed to form the pattern of radial stripes 210 separated by radial stripes 211 and by a radial gap region 211a that expose portions of neutral layer 205. The e-beam tool patterns the resist layer so that the radial stripes 211 have a circumferential spacing or stripe pitch that is approximately an integer multiple of $L_0$ (i.e., $nL_0$), the known natural pitch for the selected BCP that will be subsequently deposited. In FIG. 6B, n is 2. The e-beam tool also patterns the resist layer so that the gap region 211a has the desired circumferential width. Only one gap region 211a is depicted, but there would typically be multiple gap regions as required to separate the alignment marks. The circumferential width of each radial stripe 211 is selected to be approximately $0.5L_0$.

Figure 6C:
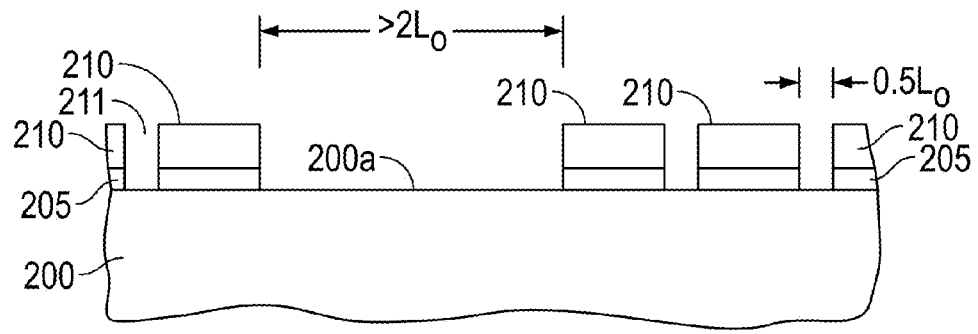
Figure 6D:
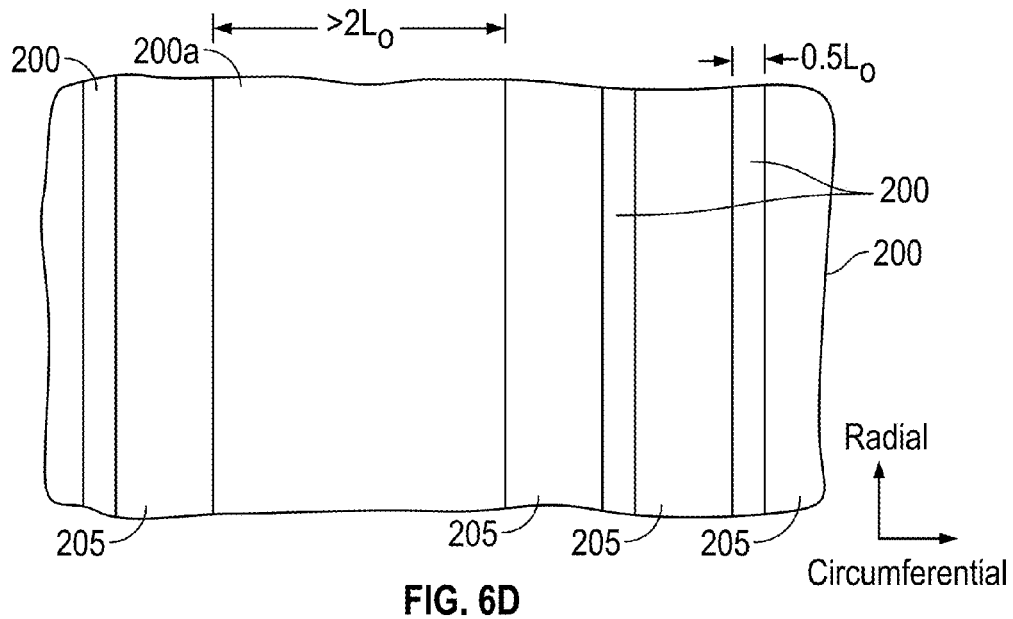

In FIG. 6C, the structure is etched, by a process of oxygen plasma reactive ion etching ($O_2$ RIE), to remove portions of neutral layer 205 in the radial stripes 211 and gap region 211a, which exposes the substrate 200. Alternatively, the chemical structure of the exposed portions of neutral layer 205 in the radial stripes 211 and gap region 211a can be chemically damaged or altered (by oxygen plasma etching or other process such as reactive ion etching, neutral atom (such as Ar) or molecule milling, ion bombardment and photodegradation) so that the exposed portions of neutral layer 205 have a preferred affinity (or repulsion) for one of the copolymers. In FIG. 6D, which is a top view, the resist 210 is removed, leaving on the substrate 200 a pattern of generally radial stripes 205 of polymer brush material and generally radial stripes 200 and gap region 200a of exposed substrate (or chemically altered neutral layer material). In this pattern the generally radial stripes 200 have a circumferential width of $0.5L_0$ and a circumferential pitch of $2L_0$ and the gap region has a circumferential width greater than $5L_0$. Because FIG. 6D is only a very small portion of the submaster template, the stripes 200 and gap region 200a appear as parallel stripes. However, the stripes 200 and gap region 200a are arranged generally radially, as depicted by marks 320 and gaps 322, respectively, in FIG. 5D.

Figure 6E:
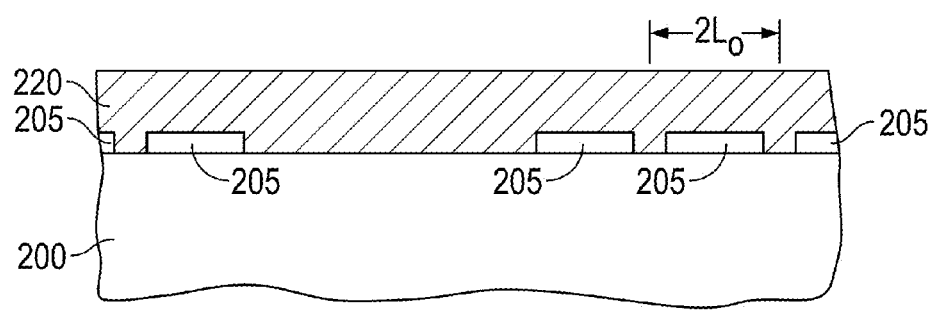

Next, in FIG. 6E, a layer 220 of BCP material is deposited over the radial stripes 205 of brush material and onto the exposed substrate 200. The preferred BCP material is the lamellae-forming diblock copolymer polystyrene-block-polymethylmethacrylate (PS-b-PMMA) with $L_0$ between about 8 nm and 60 nm and is deposited by spin coating to a thickness of about $0.5L_0$ to $3L_0$.

Figure 6F:
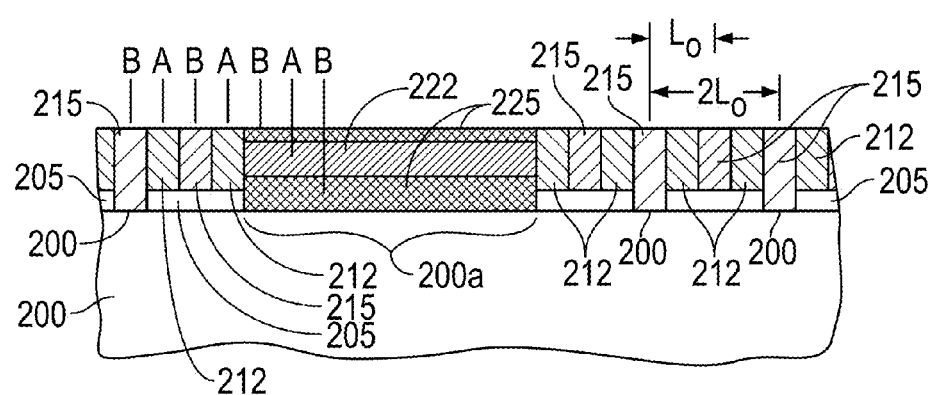

In FIG. 6F, the BCP layer has been annealed, for example by heating to about 250° C. for approximately 60 minutes under nitrogen atmosphere, which results in phase separation between the A and B components contained in the BCP. Alternatively, the BCP can be "annealed" by exposure to one solvent vapor or a mixture of multiple types of solvent vapor. The exposure to vapor, also called "solvent annealing", will lower the glass transition temperature Tg of the BCP layer below room temperature when exposed to the vapor. After the vapor is removed (or purged) the A and B components of the BCP will be in their final phase-separated state. In this example, the B component (PMMA) has an affinity for the substrate surface 200 (or for the polar groups of the chemically altered neutral layer material) and thus form as generally radial lines 215 on top of the radial stripes 200. Because the circumferential width of the stripes 200 is approximately $0.5L_0$, the A component (PS) form in adjacent radial lines 212 on the radial bars 205 of polymer brush material. As a result of the self-assembly of the A and B components this causes the B component to also form as generally radial lines 215 on the centers of each radial stripe 205 of polymer brush material. The generally radial stripes 200 thus guide the self-assembly of the PS and PMMA components to form the alternating radial lines 212, 215 in the structure as shown in FIG. 6F. The A and B BCP components in the radial lines 212, 215 become arranged as lamellae perpendicular to the substrate.

Although the A and B components prefer to self-assemble in parallel lines 212, 215 with a period of $L_0$, the substrate pattern of radial stripes 200 guides the alternating lines 212, 215 to form as radial lines, which means that that $L_0$ cannot be constant over the entire radial length. However, a pattern of alternating radial lines 212, 215 can be accomplished without any significant defects if the variation from $L_0$ does not exceed approximately 10 percent. Thus, to achieve this, the circumferential spacing of the radial stripes 200 at the zone ID should not be less than about $0.9nL_0$ and the circumferential spacing of the radial stripes 200 at the zone OD should not be greater than about $1.1nL_0$ (n is an integer).

However, because the exposed gap region 200a of the substrate has a circumferential width greater than $5L_0$, the A and B BCP components cannot form as lamellae perpendicular to the substrate but instead become arranged as lamellae parallel to the substrate. This is shown in FIG. 6F with A component 222 on substrate 200 in gap region 200a, B component 225 on top of the lower A component 222, and A component 222 on top of B component 225, all oriented as lamellae parallel to the substrate.

Figure 6G:
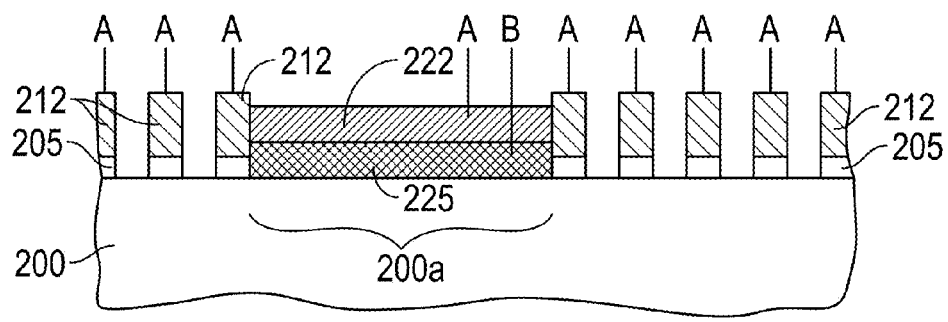
Figure 6H:
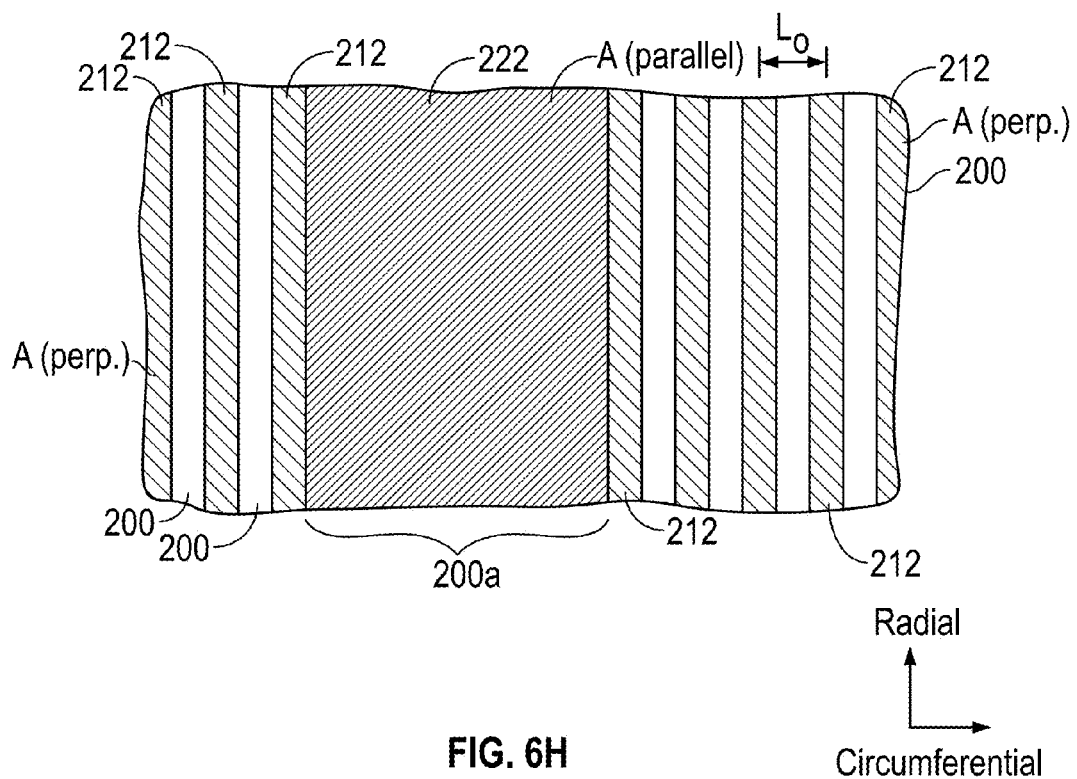

Next, in FIG. 6G, the B component (PMMA) is selectively removed by a wet etch (acetic acid, IPA or other selective solvent) or a dry etch process ($O_2$ RIE), leaving generally radial lines 212 of the A component (PS) arranged as lamellae perpendicular to the substrate and the A component 222 (and underlying B component 225) in gap region 200a arranged as a lamellae parallel to the substrate.

FIG. 6H is a top view of FIG. 6G and shows the generally radial A-component lines 212 (oriented perpendicular to the substrate) with a circumferential spacing $L_0$ and the A-component 222 (oriented parallel to the substrate) in gap region 200a. In FIG. 6H the circumferential density of radial lines 212 has been doubled from the circumferential density of radial stripes 200 in FIG. 6D. The A-component radial lines 212 and A-component 222 in gap region 200a are then used as an etch mask to etch away unprotected portions of the substrate 200. After the substrate 200 has been etched, the A-component radial lines 212 (and underlying neutral layer 205) and the A-component 222 (and underlying B-component 225) are removed by an $O_2$ RIE process or by forming gas RIE or ashing or by a wet process.

Figure 6I:
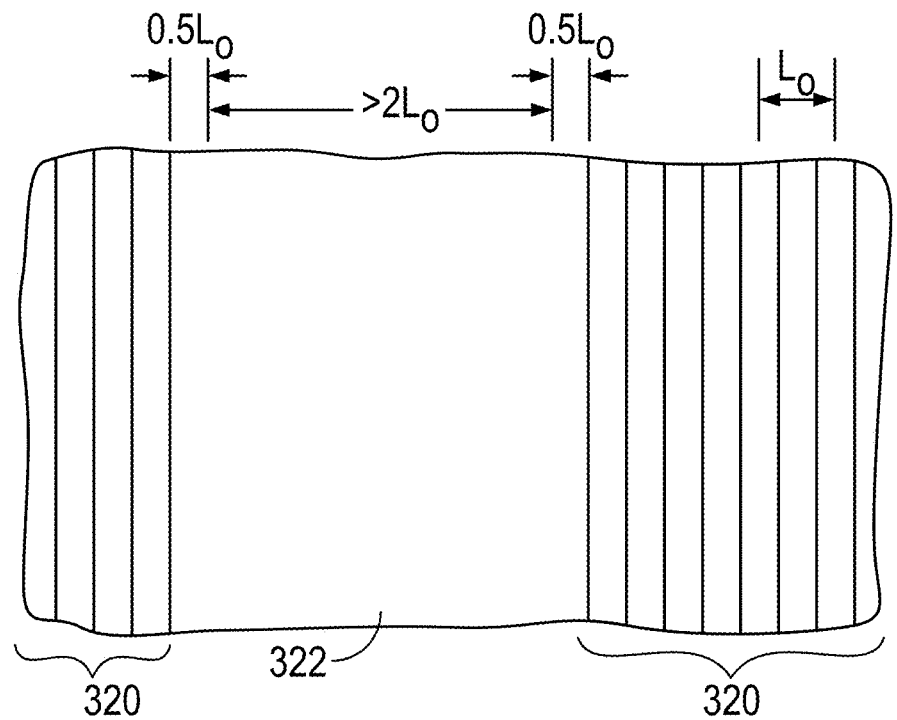
Figure 6J:
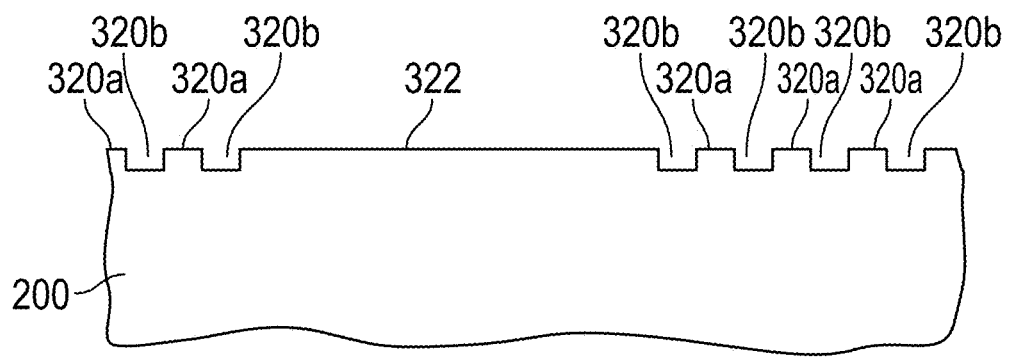

FIG. 6I is a top plan view and FIG. 6J is a sectional view of the resulting submaster template and illustrating portions of two radial alignment marks 320 separated by a gap 322, like that depicted in FIG. 5D. The etched substrate has etched radial recesses 320b which are arranged as generally radial lines with a circumferential spacing $L_0$ and radial protrusions 320a also with a circumferential spacing $L_0$. Because the gap region 322 (and its two adjacent radial lines) were protected by the A-component etch mask, no recesses were formed in this area. The gap region 322 is now the surface of substrate 200 (as shown in FIG. 6J) with a circumferential gap width equal to the gap width of the A-component lamellae parallel to the substrate (which is greater than $5L_0$) plus the circumferential width of the two adjacent radial lines of the A component ($L_0$). The portions of the substrate that were protected by the A-component etch mask can be considered as substrate protrusions separated by recesses, as shown in FIG. 6J. The etched substrate 200 can now function as a submaster template to be used to pattern generally radial lines in the active area. The alignment marks 320 and gaps 322 that were formed in the non-active area simultaneous formation of the radial lines in the active area are used to align the submaster template in the imprinting tool.

Figure 7A:
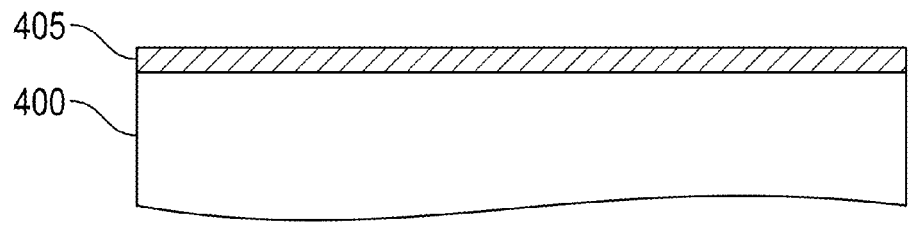

A second method for making the template of this invention will be described with FIGS. 7A-7O for an example where the template has circular alignment marks 310 separated by gaps 312 (FIG. 5A-5B). Referring to FIG. 7A, the substrate 400 that will ultimately become the master or submaster template may be formed of any suitable material, such as, but not limited to, single-crystal Si, amorphous Si, silica, fused quartz, silicon nitride, carbon, tantalum, molybdenum, chromium, alumina and sapphire. A sublayer 405 of a material known as the "mat" layer that shows strong wetting affinity by one of the polymer blocks over the other, is deposited onto the substrate 400. The material of mat layer 405 can be, but is not limited to, a cross-linkable polymer "A" or "B". In the present example, the material of layer 405 is a crosslinkable polystyrene (XPS mat). The XPS mat is spin-coated on substrate 400 to a thickness of about 3-10 nm, and crosslinked (thermally at about 250° C. in this example). The purpose of the layer 405 is to tune the surface energy adequately to promote the desired domain orientation and to provide the adequate wetting conditions for density multiplication.

Figure 7B:
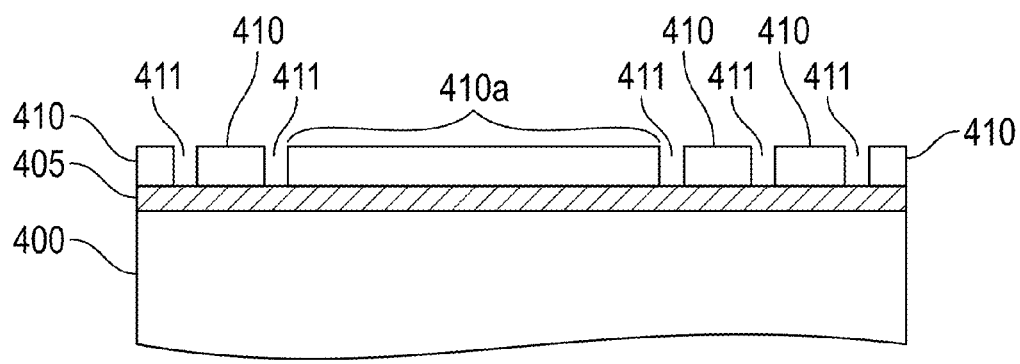

In FIG. 7B a resist layer has been deposited on the layer 405 and patterned by e-beam lithography. The resist may be a positive e-beam resist like poly methyl methacrylate (PMMA) or ZEP520 from Zeon Chemicals, L.P. The resist layer is patterned by e-beam and developed both in the active area and the non-active area in a single lithographic step. FIG. 7B depicts the non-active area where the alignment marks will be formed. In the non-active area, the e-beam writing is only done where the alignment marks are to be located, in the same manner that the active area is e-beam written. The e-beam writes, in a positive resist, trenches 411 that expose portions of mat layer 405, separated by unexposed resist stripes 410. The large region in the non-active area with no e-beam writing forms lands 410a. The stripes 410 and trenches 411 have a pitch that is approximately an integer multiple of $L_0$ (i.e., $nL_0$), the known natural pitch for the selected BCP that will be subsequently deposited. The choice of BCP, therefore $L_0$, is determined by the pitch needed in the active area. In FIG. 7B, n is 2. Only one wide region 410a (lateral dimension larger than 2) is depicted, but there would typically be multiple lands spaced in the non-active area of the substrate. The borders of all the lands will confine groups of trenches 411/stripes 410 which make up the shape of the alignment marks that will ultimately be etched into substrate 400. The width of each stripe 410 at this step is typically larger than $0.5L_0$. In disk drive applications where a rotary e-beam writer is used, the lateral orientation of the stripes/trenches is either generally circumferential or radial. In other applications where x-y e-beam writers are used, the lateral orientation of the stripes/trenches is either generally horizontal or vertical.

Figure 7C:
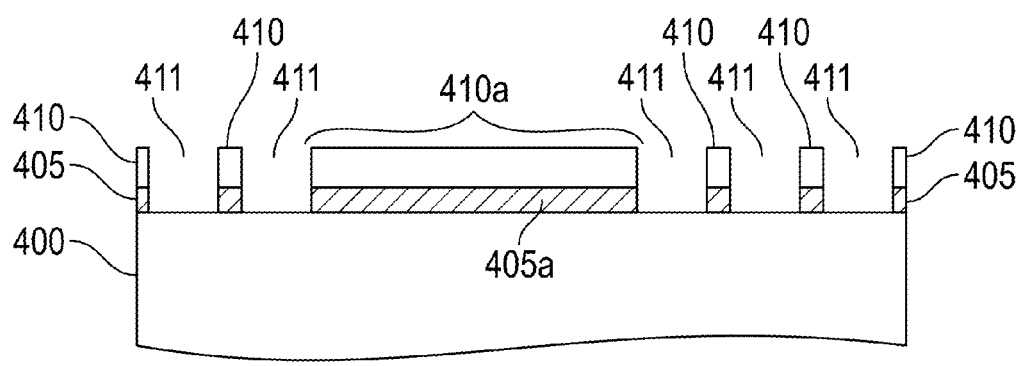
Figure 7D:
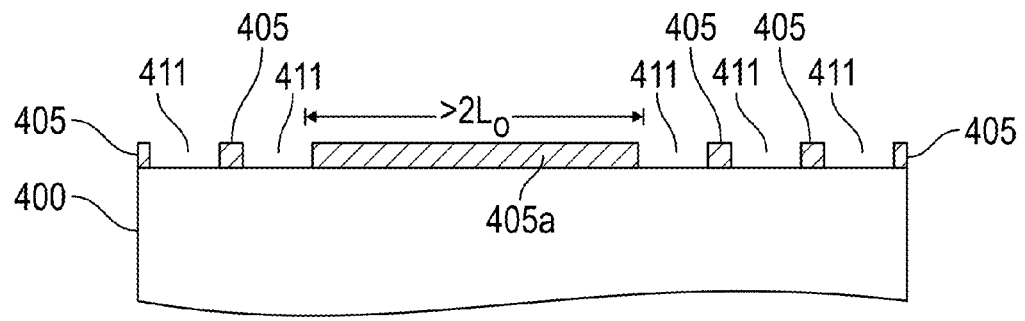

In FIG. 7C, a lateral trimming process, typically a low DC bias oxygen plasma reactive ion etching ($O_2$ RIE) process, is used to adjust the width of the stripes 410 to approximately $0.5L_0$ (depicted), or $1.5L_0$, followed by more $O_2$ RIE (with possibly higher DC bias) to remove portions of the mat layer 405 in the trenches 411, which exposes the substrate 400. The stripes 410 and lands 410a of resist are then removed by a solvent, leaving on the substrate 400 narrow stripes 405 and large lands 405a of mat, and trenches 411 of exposed substrate 400, as shown in FIG. 7D.

Figure 7E:
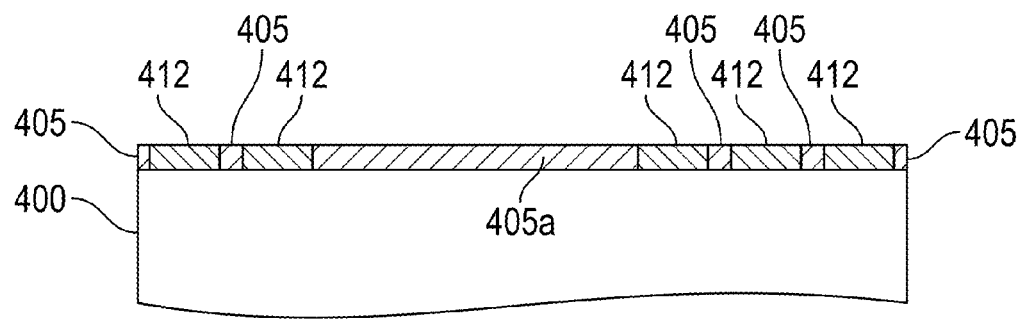

In the next step, shown in FIG. 7E, another layer of material, referred to here as the "back-fill material" that has a different wetting property from the mat layer 405, is deposited onto the surface. The back-fill material can be, but is not restricted to, a functionalized polymer brush, or a functionalized random copolymer "A-r-B". The functional group may be, for example, a hydroxyl group. In the present example, the back-fill material is a hydroxyl-terminated (polystyrene-r-PMMA brush). The functional group allows the material to be chemically bonded to only the exposed substrate (trenches 411 in FIG. 7D) to form stripes 412 but not to the mat covered areas (stripes 405 and lands 405a). A thermal treatment is typically used to induce the chemical bonding and a solvent rinse followed to remove the residual material that is not bonded to the surface. The alternating mat (405, 405a) and backfill material (412) on the surface will serve as the chemical contrast pattern for the directed self-assembly of the BCP that will be applied.

Figure 7F:
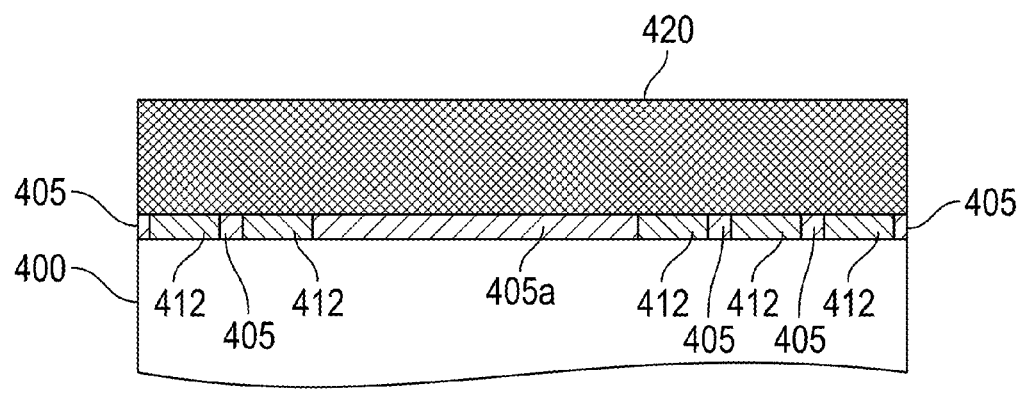

Next, as shown in FIG. 7F, a layer 420 of BCP material is deposited over the chemical contrast pattern defined in FIG. 7E. The preferred BCP material is a lamellae-forming copolymer, such as polystyrene-block-polymethylmethacrylate (PS-b-PMMA), with $L_0$ between about 8 nm and 30 nm and is deposited by spin coating to a thickness of about $0.5L_0$ to $3L_0$.

Figure 7G:
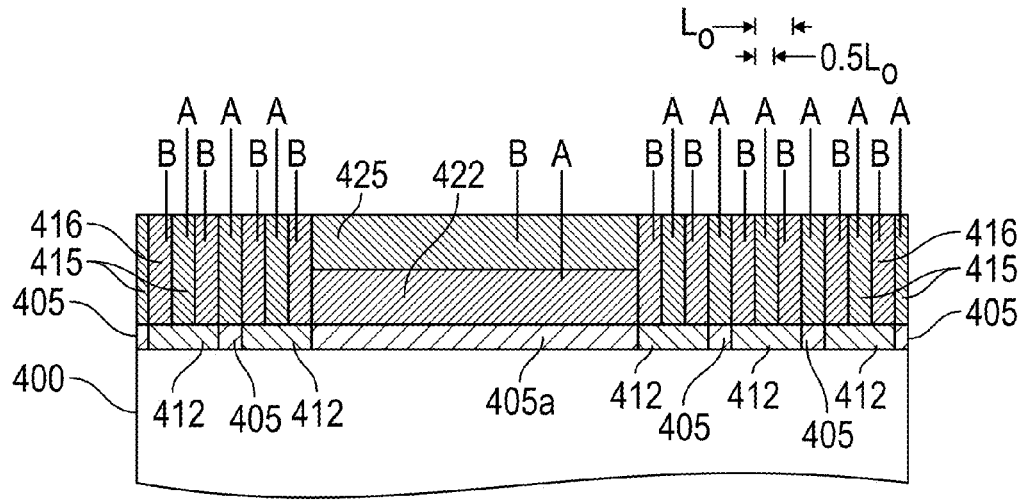

In FIG. 7G, the BCP layer has been annealed, for example by heating to about 250° C. for approximately 60 minutes under nitrogen atmosphere, which results in phase separation between the A and B components contained in the BCP. Alternatively, the BCP can be "annealed" by solvent annealing. After the vapor is removed (or purged) the A and B components of the BCP will be in their final phase-separated state. In this example, the A component (PS) has an affinity for the mat surfaces and thus forms lines 415 and lands 422 on top of mat stripes 405 and mat lands 405a. When the width of the mat stripes 405 is approximately $0.5L_0$, the B component (PMMA) form in adjacent lines 416 on the backfill material stripes 412. As a result of the self-assembly of the A and B components this causes the A component to also form lines 415 on the centers of each backfill material stripe 412. The chemical contrast pattern of mat stripes 405 and backfill material stripes 412 thus guide the self-assembly of the PS and PMMA components to form the alternating radial lines 415 and 416 in the structure as shown in FIG. 7G. The A and B BCP components in lines 415, 416 become arranged as lamellae perpendicular to the substrate. The A and B components prefer to self-assemble in parallel lines 415, 416 with a period of $L_0$. If the alternating stripes 405 and 412, determined by the data patterns on the submaster template, are generally circumferential lines, or horizontal lines, or vertical lines, the spacing between stripes 405 is constant. In the case where the alternating stripes 405 and 412 are generally radial lines, the $L_0$ cannot be constant over the entire radial length. However, a pattern of alternating radial lines 415, 416 can be accomplished without any significant defects if the variation from $L_0$ does not exceed approximately 10 percent. Thus, to achieve this, the circumferential spacing of the lines 415 at the zone ID should not be less than about $0.9nL_0$ and the circumferential spacing of the radial lines 415 at the zone OD should not be greater than about $1.1nL_0$ (n is an integer).

However, because the wide mat region lands 405a has a lateral dimension greater than $5L_0$, the A and B BCP components cannot form as lamellae perpendicular to the substrate but instead become arranged as lamellae parallel to the substrate. This is shown in FIG. 7G with A component 422 on top of lands 405a of mat, and B component 425 on top of the lower A component 422, all oriented as lamellae parallel to the substrate.

Figure 7H:
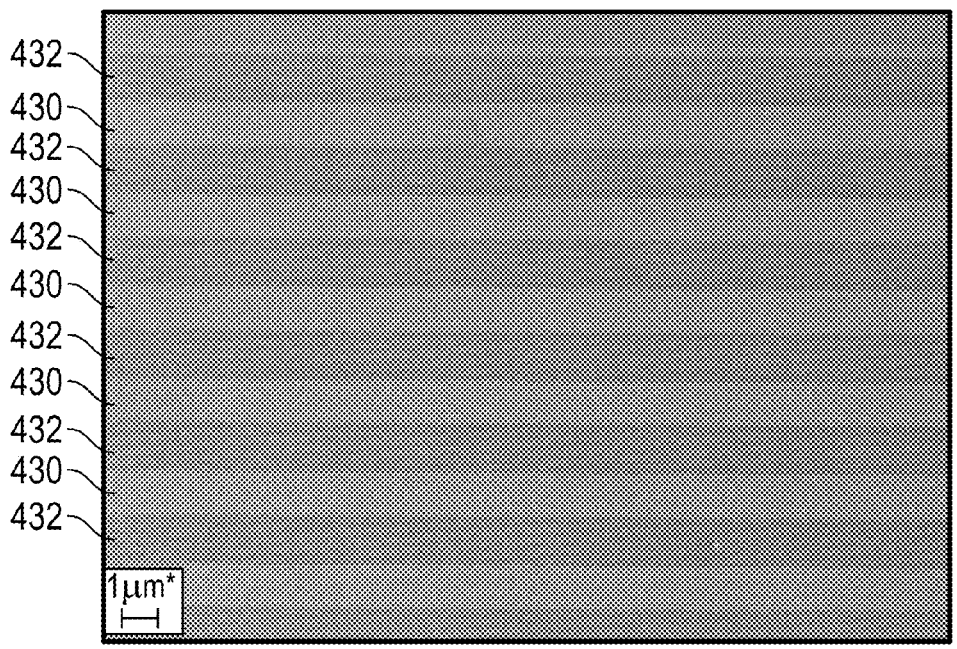
FIG. 7H is a top view of a scanning electron microscopy (SEM) image of the structure after the self assembly depicted in FIG. 7G.
Figure 7I:
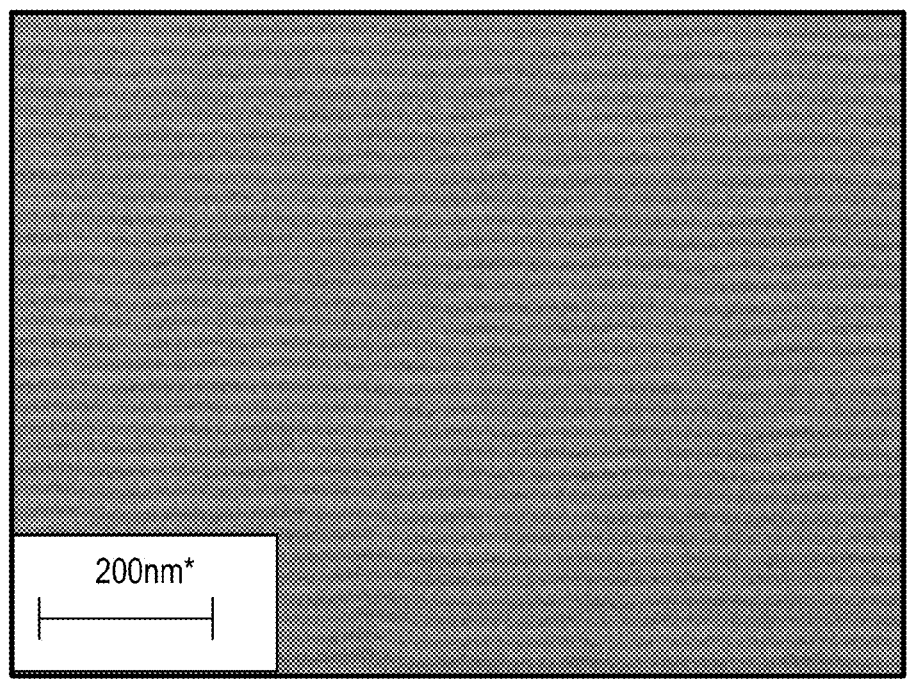
FIG. 7I is an enlarged view one of the alignment marks in the SEM image of FIG. 7H.

FIG. 7H and FIG. 7I are top views of scanning electron microscopy (SEM) images of the structure after the self assembly. In this example, as shown in FIG. 7H, the bands 430 are patterned as circular gratings with a radial pitch of approximately 2 μm. Because the images show only a small portion of the complete circular gratings, the alternating bands appear as straight lines. In the low magnitude image in FIG. 7H, the lighter bands 432 correspond to lands 425 in FIG. 7G that will ultimately form gaps between alignment marks (like gaps 312 in FIG. 5B), while the darker bands 430 with "Moire fringes" correspond to groups of alternating lines 415 and 416, with each group ultimately forming an alignment mark on the completed template (like alignment marks 310 in FIG. 5B). An enlarged view of a portion of one the bands 430 is shown in the high magnification image in FIG. 7I, in which brighter lines correspond to lines 415, and darker lines corresponds to lines 416. The radial pitch of the alternating lines 415, 416 in each band 430 is approximately 25 nm.

Figure 7J:
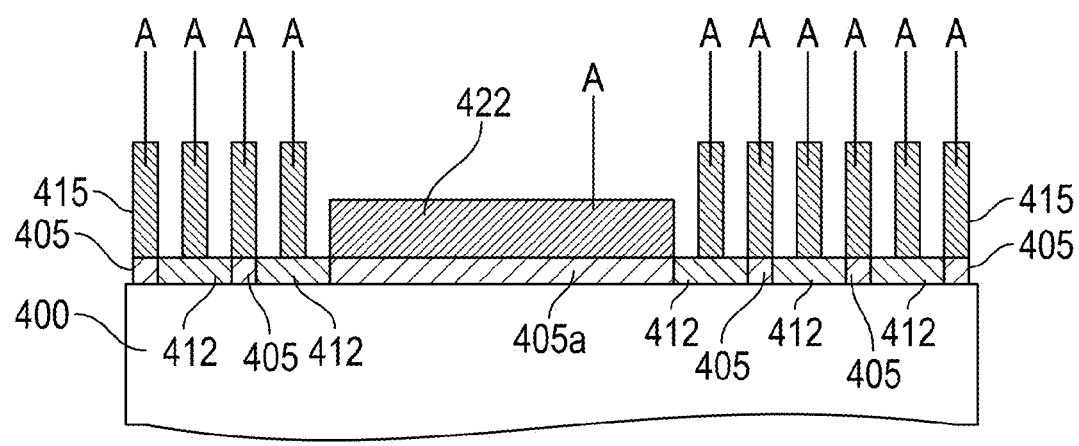

The next step is to selectively remove one block of the BCP. The removal of one block can be done by a wet etch (such as acid or solvent), or a dry etch (such as $O_2$ RIE) in which the etch rate of one block is faster than that of the other. For PS-b-PMMA, this can be achieved by selectively removing the B block (PMMA) by a wet etch (acetic acid, IPA or other selective solvent) or a dry etch process ($O_2$ RIE), leaving lines 415 of the A component (PS) arranged as lamellae perpendicular to the substrate and the A component 422 in lands region 405a arranged as a lamellae parallel to the substrate. FIG. 7J shows the resulting cross-section after the B component removal. Another way to selectively remove one block of the BCP is to first use a selective hardening process to convert one block into a hard material and then remove the other block using a wet or dry etch. The selective hardening process can significantly improve the etch selectivity between the two blocks in the removal chemistry such as $O_2$ RIE. For PS-b-PMMA, one example of such selective hardening process is to infuse a material such as trimethylaluminum (TMA) that only bonds to PMMA molecules but not PS molecules, and subsequently convert it aluminum oxide by introducing $H_2O$ vapor, which hardens the PMMA block into a aluminum oxide containing block. In an $O_2$ RIE, the PS blocks etch much faster than the aluminum-oxide-containing block, leaving only the aluminum-oxide-containing block on the surface after the removal process.

Figure 7K:
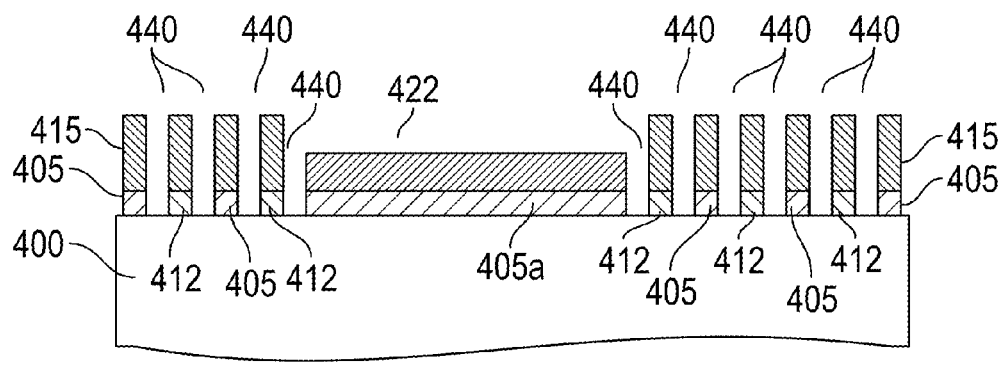

Next, as shown in FIG. 7K, after one block copolymer is removed, $O_2$ RIE is used to etch into the exposed backfill material 412 to remove the material not covered by lines 415 and lands 422, forming trenches 440 which expose portions of the substrate 400. The patterns will be further transferred into the substrate 400. By using different pattern transfer methods, it is possible to control whether the large lands under 422 and 405a will result in either protrusions or recesses in the substrate 400 after etching.

Figure 7L:
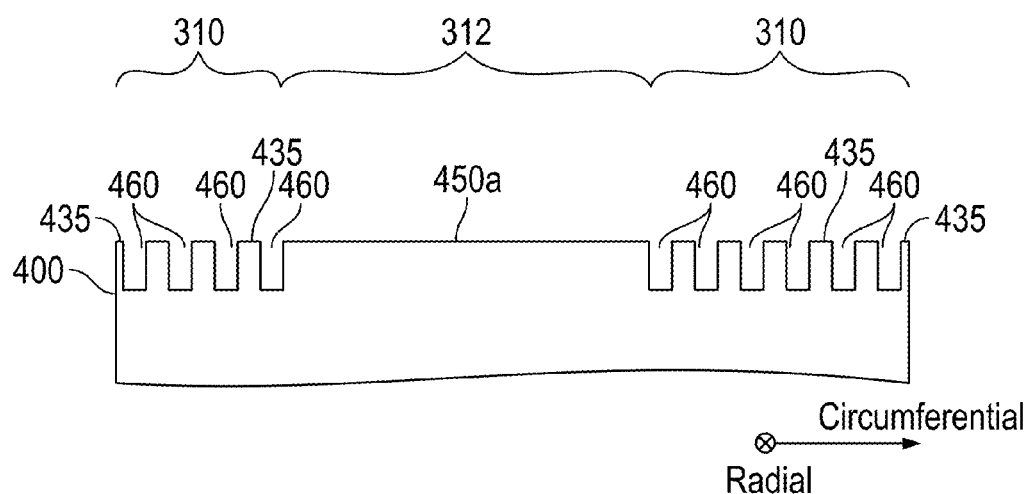

FIG. 7L shows one example of the process to use lines 415 and lands 422 FIG. 7K as an etch mask to etch into the substrate 400. The unprotected portions of the substrate 400 under trenches 440 will be etched. The etch mask lines 415, with underlying mat 405 and backfill material 412, and lands 422, with underlying mat 405a, are removed by a $O_2$ RIE process, a forming gas RIE, an ashing or a wet process. The resulting structure is shown in FIG. 7L. The trenches 460 are the portions of the substrate 400 that are etched (recessed) to define circumferential stripes 435. The large area previously covered by lands 422 is protruded (mesa), having a top surface at the same height as those of the stripes 435. The stripes 435 have a radial pitch of $L_0$, which is the same as the track pitch of the data pattern. In the non-active area, each pattern of stripes 435 and trenches 440, make up a single alignment mark 470, separated by large lands 450a that function as gaps between the alignment marks. FIG. 7L thus depicts portions of two circular alignment marks 310 separated by a circular gap 312 (see FIG. 5B).

Figure 7M:
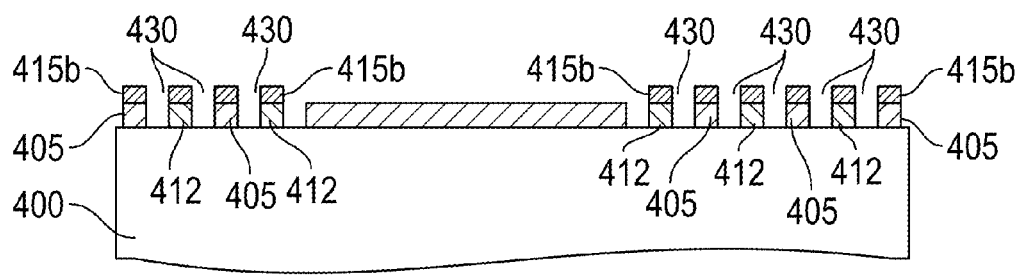
Figure 7N:
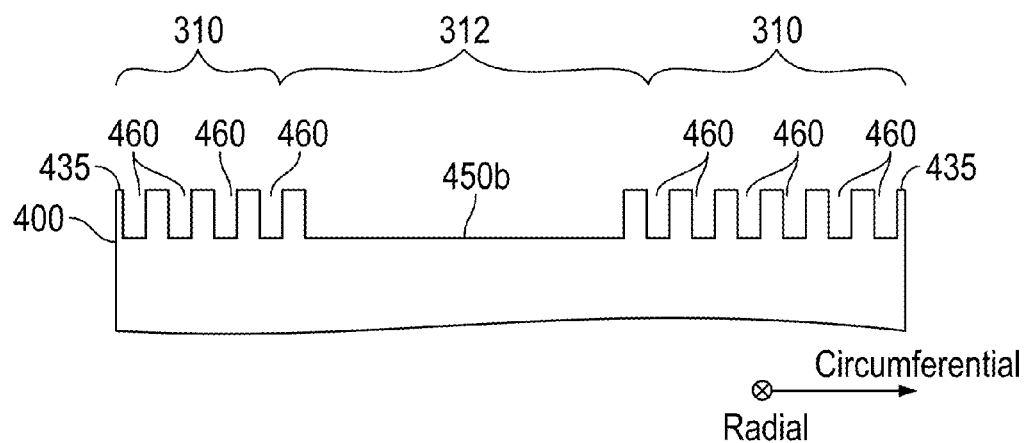

Another process to from the pattern of alignment marks in the substrate 400 is depicted in FIG. 7M. Additional $O_2$ RIE is performed on the structure shown in FIG. 7K. Because the top surface of lands 422 in FIG. 7K is lower than that of lines 415, the additional $O_2$ RIE can remove lands 422 and underlying mat 405a, while leaving on the substrate lines 415b with reduced height and underlying mat stripes 405 and backfill material stripes 412, as shown in FIG. 7M. The substrate 400 is then etched using features 415b, with underlying mat stripes 405 and backfill material stripes 412, as an etch mask. After removing etch mask features 415b, 405 and 412 by a $O_2$ RIE process, a forming gas RIE, an ashing or a wet process, the resulting structure is shown in FIG. 7N. While the stripes 435 and trenches 440 are the same as in the previous example of FIG. 7L, the large lands 450b are now recessed from the surface of substrate 400.

To enhance the process yield and pattern quality, it is often necessary for the templates to have a desired polarity. This can be achieved by adding a tone reversal procedure (not shown) before final etching of the substrate 400. The tone reversal procedure basically introduces a hard mask material using deposition on the polymeric material and in all recesses between the stripes/lands of the polymeric material, and then removes the hard mask material on the polymeric material as well as the polymeric material to expose the underlying portions of the substrate. The tone reversal step may be, but is not limited to, a lift-off process. The hard mask material may be a metal, a dielectric, a semiconductor, or a combination thereof. The pattern of the hard mask material then has a opposite polarity to that of the polymeric material. If the pattern of the hard mask material is used as the mask for etching the substrate 400, the polarity of the template is then reversed. FIG. 7O shows the structure of a template having an opposite polarity of that shown in FIG. 7N.

Figure 7O:
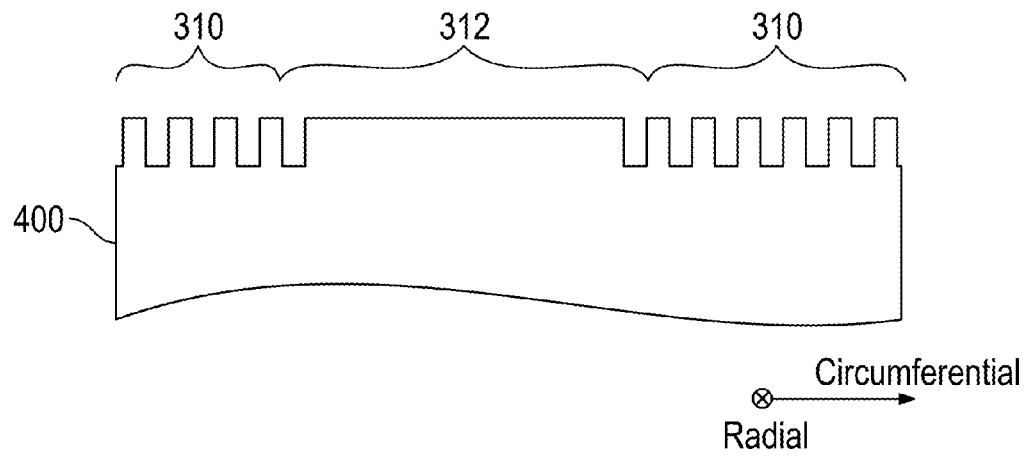

The stripes 210 in the method of FIGS. 6A-6J and the stripes 410 in the method of FIGS. 7A-7O have been described as generally radial stripes or concentric generally circular rings because the methods have been described for making an imprint template for manufacture of magnetic recording disks. However, the stripes 210 or 410 may be patterned as generally parallel stripes if the resulting etched substrate is to be used as imprint template for the manufacture of semiconductor devices.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method using a block copolymer (BCP) for making a imprint template containing active structures in an active area and optically-detectable alignment marks in a non-active area, the method comprising:
   providing a substrate having an active area and a non-active area;
   depositing on the substrate a sublayer for the BCP;
   patterning the sublayer into a pattern of stripes in the active area, and stripes and gap regions in the non-active area, the stripes being generally equally spaced and having a stripe pitch of approximately $nL_0$, where n is an integer and $L_0$ is the natural pitch of the BCP, and the gap regions having a gap width greater than $5L_0$;
   forming on the patterned sublayer a BCP having a natural pitch $L_0$, the BCP material being guided by the stripes to self-assemble into alternating lines of first and second components of the BCP arranged as lamellae perpendicular to the substrate with the lines of the first component having a line pitch of approximately $L_0$ and the lines of the second component having a line pitch of approximately $L_0$, the BCP self-assembling in the gap regions as alternating first and second components of the BCP arranged as lamellae parallel to the substrate;
   removing the lines of the second component; and
   etching the substrate, leaving lines of recesses in the substrate having a line pitch of approximately $L_0$, the lines of recesses forming active structures in the active area, the lines of recesses separated by gap regions forming optically-detectable alignment marks in the non-active area.

2. The method of claim 1 wherein removing the lines of the second component leaves the lines of the first component on the substrate; wherein etching the substrate comprises using the lines of the first component on the substrate as a mask; and further comprising, after etching the substrate, removing the lines of first component on the substrate.

3. The method of claim 1 further comprising:
   after removing the lines of the second component, depositing a layer of hard mask material on the substrate and the first component;
   removing the lines of first component, leaving lines of hard mask material on the substrate;
   wherein etching the substrate comprises using the lines of hard mask material as a mask; and further comprising, after etching the substrate, removing the lines of hard mask material on the substrate.

4. The method of claim 1 wherein removing the lines of the second component comprises selective hardening of the first component.

5. The method of claim 1 wherein the stripes are concentric generally circular rings and the stripe pitch is the radial pitch of the rings, whereby the lines of recesses in the substrate are concentric generally circular lines and the line pitch of the recesses is the radial pitch of the circular lines.

6. The method of claim 1 wherein the stripes are radial bars and the stripe pitch is the circumferential pitch of the bars, whereby the lines of recesses in the substrate are radial lines and the line pitch of the recesses is the circumferential pitch of the radial lines.

7. The method of claim 1 wherein depositing the sublayer comprises depositing a layer of a material that does not show a strong wetting affinity by one of the BCP components over the other.

8. The method of claim 7 wherein patterning the sublayer into a pattern of stripes and gap regions comprises depositing a resist layer on the sublayer, patterning the resist layer by e-beam, developing the resist, etching the sublayer using the patterned resist and removing the resist to expose portions of the substrate.

9. The method of claim 1 wherein depositing the sublayer comprises depositing a layer of a material showing a strong wetting affinity by one of the BCP components over the other.

10. The method of claim 9 wherein patterning the sublayer into a pattern of stripes and gap regions comprises depositing a resist layer on the sublayer, patterning the resist layer by e-beam, developing the resist, etching the sublayer using the patterned resist, removing the resist to expose portions of the substrate and backfilling the exposed portions of the substrate with material that bonds to the exposed portions of the substrate without bonding to the sublayer.

11. The method of claim 10 wherein the sublayer is crosslinkable polystyrene and the backfilling material is selected from a functionalized polymer brush and a functionalized random copolymer.

12. A method using a block copolymer (BCP) for making an imprint template containing optically-detectable alignment marks:
   providing a substrate having an active area and a non-active area;
   depositing on the substrate in the non-active area a sublayer of material having a strong wetting affinity by one of the BCP components over the other;
   depositing a resist layer on the sublayer;
   patterning the resist layer by e-beam into a pattern of stripes and gap regions, the stripes being generally equally spaced and having a stripe pitch of approximately $nL_0$, where n is an integer and $L_0$ is the natural pitch of the BCP, and the gap regions having a gap width greater than $5L_0$;
   after developing the resist, etching the sublayer using the patterned resist;
   removing the resist, leaving exposed portions of the substrate and portions of the sublayer including gap regions of sublayer;
   backfilling the exposed portions of the substrate with backfill material that bonds to the exposed portions of the substrate without bonding to the sublayer;
   forming on the sublayer and backfill material a BCP having a natural pitch $L_0$, the BCP material being guided by the sublayer to self-assemble into alternating lines of first and second components of the BCP arranged as lamellae perpendicular to the substrate with the lines of the first component having a line pitch of approximately $L_0$ and the lines of the second component having a line pitch of approximately $L_0$, the BCP self-assembling in the gap regions of the sublayer as alternating first and second components of the BCP arranged as lamellae parallel to the substrate;
   removing the lines of the second component, leaving the lines of the first component on the substrate;
   etching the substrate, using the lines of the first component as a mask; and
   removing the lines of the first component, leaving lines of recesses in the substrate having a line pitch of approximately $L_0$, the lines of recesses forming optically-detectable alignment marks in the non-active area.

13. The method of claim 12 wherein patterning the resist layer into a pattern of stripes comprises patterning the resist layer into a pattern of concentric generally circular rings, whereby the lines of recesses form concentric generally circular lines in the substrate.

14. The method of claim 12 wherein patterning the resist layer into a pattern of stripes comprises patterning the resist layer into a pattern of generally radial bars, whereby the lines of recesses form generally radial lines in the substrate.

15. The method of claim 12 wherein patterning the resist layer into a pattern of stripes comprises patterning the resist layer into a pattern of generally parallel straight stripes, whereby the lines of recesses form generally parallel straight lines in the substrate.

\* \* \* \* \*